(12) United States Patent
Chang

(10) Patent No.: US 8,148,218 B2
(45) Date of Patent: Apr. 3, 2012

(54) SEMICONDUCTOR DEVICE WITH GROUP III-V CHANNEL AND GROUP IV SOURCE-DRAIN AND METHOD FOR MANUFACTURING THE SAME

(75) Inventor: Chun-Yen Chang, Baoshan Township, Hsinchu County (TW)

(73) Assignee: National Chaio Tung University, Hsinchu (TW)

( * ) Notice: Subject to any disclaimer, the term of this patent is extended or adjusted under 35 U.S.C. 154(b) by 0 days.

(21) Appl. No.: 13/044,597

(22) Filed: Mar. 10, 2011

(65) Prior Publication Data

US 2011/0183480 A1    Jul. 28, 2011

Related U.S. Application Data

(63) Continuation of application No. 12/755,465, filed on Apr. 7, 2010, now Pat. No. 7,928,427.

(30) Foreign Application Priority Data

Nov. 27, 2009 (TW) ................................ 98140529 A

(51) Int. Cl.
*H01L 21/335* (2006.01)
*H01L 21/336* (2006.01)
(52) U.S. Cl. ...................................................... 438/168
(58) Field of Classification Search ............... 257/24, 257/19, 335, 336, 344, 345, E29.297–E29.298, 257/E33.009, E31.035, E29.104, E29.193, 257/E21.093, E21.102, E21.182, E21.207, 257/E21.371, E21.387, E21.403–E21.407, 257/E21.441, E21.445, E21.448–E21.452, 257/9–39, 51, 85, 90, 94, 96, 97, 183–201; 438/282, 168, 212, 213, 216, 217, 289
See application file for complete search history.

(56) References Cited

U.S. PATENT DOCUMENTS

| | | | | |
|---|---|---|---|---|
| 5,557,129 | A * | 9/1996 | Oda et al. ....................... | 257/345 |
| 6,482,691 | B2 * | 11/2002 | Wu et al. ........................ | 438/217 |
| 2002/0037619 | A1 * | 3/2002 | Sugihara et al. ............... | 438/289 |
| 2006/0046399 | A1 | 3/2006 | Lindert et al. | |
| 2006/0153216 | A1 * | 7/2006 | Hosein et al. .................. | 370/412 |
| 2006/0197148 | A1 * | 9/2006 | Hsu ................................ | 257/335 |
| 2007/0252203 | A1 * | 11/2007 | Zhu et al. ....................... | 257/345 |

OTHER PUBLICATIONS

Zong-You Han et al., "Heteroepitaxy of $Si_xGe_{1-x}$ (x<5%) source/drain on GaAs substrates for the application of III-V MOSFETs", 2009 International Conference on Solid State Devices and Materials (SSDM 2009), 4 pp. Guang-Li Luo et al., "Ge Epitaxial Growth on GaAs Substrates for Application to Ge-Source/Drain GaAs MOSFETs", Journal of Electrochemical Society, 157 (1) H27-H30 (2010), 4 pp.
U.S. Appl. No. 12/755,465, filed Apr. 7, 2010, Chun-Yen Chang, National Chiao-Tung University.

* cited by examiner

*Primary Examiner* — Dao H Nguyen
*Assistant Examiner* — Tram H Nguyen
(74) *Attorney, Agent, or Firm* — Bui Garcia-Zamor; Hung H. Bui, Esq.

(57) ABSTRACT

The present invention is related to a semiconductor device with group III-V channel and group IV source-drain and a method for manufacturing the same. Particularly, the energy level density and doping concentration of group III-V materials are increased by the heteroepitaxy of group III-V and group IV materials and the structural design of elements. The method comprises: preparing a substrate; depositing a dummy gate material layer on the substrate and defining a dummy gate from the dummy gate material layer by photolithography; performing doping by self-aligned ion implantation using the dummy gate as a mask and performing activation at high temperature, so as to form source-drain; removing the dummy gate; forming a recess in the substrate between the source-drain pair by etching; forming a channel-containing stacked element in the recess by epitaxy; and forming a gate on the channel-containing stacked element.

14 Claims, 23 Drawing Sheets

SEMICONDUCTOR DEVICE WITH GROUP III-V CHANNEL AND GROUP IV SOURCE-DRAIN AND METHOD FOR MANUFACTURING THE SAME

CROSS-REFERENCE TO RELATED APPLICATION

This application is a continuation of application Ser. No. 12/755,465 filed on Apr. 7, 2010 now U.S. Pat. No. 7,928,427 now allowed, which claims the benefit accruing under 35 U.S.C. §119 from Taiwanese Patent Application No. 098140529, filed on Nov. 27, 2009 in the Intellectual Property Office Ministry of Economic Affairs, Republic of China, the disclosures of which are incorporated by reference herein.

FIELD OF THE INVENTION

The present invention is related to a semiconductor device with group III-V channel and group IV source-drain and a method for manufacturing a semiconductor device with group III-V channel and group IV source-drain. The method is to form a group III-V channel on a group IV substrate by epitaxy, or a group IV source-drain on a group III-V element structure by epitaxy.

DESCRIPTION OF THE REALATED Art

Generally, a metal-oxide-semiconductor field effect transistor (MOSFET) with very thin gate dielectrics made from silicon dioxide may experience unacceptable gate leakage currents, so the gate dielectrics is formed with a high-dielectric-constant dielectric material, instead of silicon dioxide, thereby reducing the gate leakage current. Herein, the high dielectric constant refers to a dielectric constant higher than 10.

However, since the high-dielectric-constant gate dielectric layer may not be compatible with polysilicon, it may desirable to use metal gate electrodes in devices that includes the high-dielectric-constant gate dielectric. When a CMOS device with metal gates is made, it may be necessary to make the NMOS and PMOS from different materials. A replacement gate process may be used to form gates from different materials. In the process, a first polysilicon layer, bracketed by a pair of spacers, is selectively removed as a second polysilicon layer to create a trench between the spaces. The trench is filled with a first metal. Then, the second polysilicon layer is removed and replaced with a second metal that differs from the first metal.

US Patent Application Publication No. 2006/0046399A1 disclosed a method for forming a replacement metal gate electrode. A dummy dielectric layer and a sacrificial layer are sequentially formed on a silicon substrate 10. The dummy dielectric layer and the sacrificial layer are patterned, and a shallow source drain region 14 is formed by ion implantation using the patterned sacrificial layer as a mask. Sidewall spacers 16 and 17 are sequentially formed on the opposite sides of the sacrificial layer. Ion implantation is performed once again to form a deep source drain region 12. A dielectric layer 20 is deposited on a resultant structure, and the dielectric layer 20 on the patterned sacrificial layer is removed by chemical mechanical polishing. The sacrificial layer is removed to form a hole that is positioned between the sidewall spacers 16 and 17. A sidewall spacer 24 is formed in the hole. The dummy dielectric layer is removed by wet etching. As shown in FIG. 1, the portion of the silicon substrate 10 to be functioned as a channel portion, which is exposed by the opening between the sidewall spacers 24, is etched by dry etching, to form a trench 26. As shown in FIG. 2, a part of the trench 26 is filled with an epitaxial material 28 such as silicon germanium, germanium, InSb, or carbon-doped silicon to the level of the upper surface of the shallow source drain region 14. As shown in FIG. 3, the sidewall spacer 24 is removed. A U-shaped high-dielectric-constant dielectric layer 32 is formed. An N-type metal layer 30 is formed on the dielectric layer 32.

SUMMARY OF THE INVENTION

The Problems to be Resolved by the Present Invention

In the above-mentioned method, the trench 26 is formed in the substrate and is filled with an epitaxial material functioning as a carrier channel by depositing a single epitaxial film (i.e., the epitaxial material is a single layer without structural design), so the electrical properties of the manufactured devise are susceptible to the quality of epitaxial junction and can not efficiently confine carriers. Additionally, in the above-mentioned method, the depth of the trench 26 is arranged to be the same as the depth of the deep source drain region 12. However, for the heteroepitaxial material, the defects of the heterogeneous material may extend upward to the surface of the channel portion, resulting in degradation in electrical properties. Therefore, this arrangement is not optimized.

Although that a group III-V material is integrated into a silicon substrate to be a logic electronic device, can efficiently enhance the electrical properties of the device, once element sizes are micronized below 22 nm, a field effect transistor using the group III-V material will confront the problems of insufficient energy level density and doping concentration.

The Methods for Resolving these Problems

For resolving these problem, the inventor submits a concept that the device is designed taking the depth of the channel portion into consideration.

An aspect of the present invention is a semiconductor device with group III-V channel and group IV Source-drain, comprising: a substrate, selected from one of the group consisting of a Si substrate, a Ge substrate, a Si substrate with $Si_xGe_{1-x}$ (x=0~1) or GaN or silicon germanium carbide grown thereon, a Ge substrate with $Si_xGe_{1-x}$ (x=0~1) or GaN or silicon germanium carbide grown thereon, and a diamond substrate with $Si_xGe_{1-x}$ (x=0~1) or GaN or silicon germanium carbide grown thereon; source-drain, formed by doping a specific part of the substrate by ion implantation; a channel-containing stacked element, formed to connect the source-drain by forming a recess in the substrate between the source-drain pair and filling the recess with a group III-V material by epitaxy; and a gate, formed on the channel-containing stacked element.

Another aspect of the present invention is to combine a group III-V carrier channel and group IV source-drain by two different epitaxial techniques.

One of them is a group III-V epitaxial technique, in which group IV source-drain are first formed, and a group III-V channel is stacked. Particularly, it comprises the steps of: preparing a substrate, the substrate selected from one of the group consisting of a Si substrate, a Ge substrate, a Si substrate with $Si_xGe_{1-x}$ (x=0~1) or GaN or silicon germanium carbide grown thereon, a Ge substrate with $Si_xGe_{1-x}$ (x=0~1) or GaN or silicon germanium carbide grown thereon, and a diamond substrate with $Si_xGe_{1-x}$ (x=0~1) or GaN or silicon germanium carbide grown thereon; depositing a dummy gate material layer on the substrate and defining a dummy gate from the dummy gate material layer by photolithography; doping the exposed region of the substrate by self-aligned ion implantation using the dummy gate as a mask and activating the exposed region at high temperature, so as to form source-drain; removing the dummy gate; forming a recess in the substrate between the source-drain pair by etching, the recess having a depth required for forming a channel-containing stacked element by subsequent epitaxy; forming the channel-containing stacked element in the recess with a group III-V material by epitaxy; and forming a gate on the channel-containing stacked element.

The other is a group IV epitaxial technique, in which a group III-V channel is first stacked, and group IV source-drain are formed. Particularly, it comprises the steps of: preparing a substrate, the substrate being a group III-V substrate or a Si substrate with GaN grown thereon; forming a recess in the substrate by etching, the recess having a depth required for forming a channel-containing stacked element by subsequent epitaxy; forming the channel-containing stacked element in the recess with a group III-V material by epitaxy; depositing a dummy gate material layer on the substrate and defining a dummy gate from the dummy gate material layer by photolithography; forming a source-drain recess on the substrate by using the dummy gate as a mask; filling the source-drain recess with a group IV material by selective heteroepitaxy using the dummy gate as a mask; doping the group IV material by self-aligned ion implantation and then, activating the group IV material at high temperature, so as to form source-drain; removing the dummy gate; and forming a gate on the channel-containing stacked element.

Furthermore, the crystal plane of the substrate is (100), (110), or (111), and its off-cut angle is 2, 4, or 6 degrees.

Also, the dummy gate material layer is a single layer made of insulating material or a stacked layer made of plural insulating materials, and the material(s) may be silicon oxide, silicon oxynitride, aluminum oxynitride, or hafnium oxynitride.

Furthermore, the source-drain are made of doped $Si_xGe_{1-x}$ (x=0~1) or silicon germanium carbide.

Also, the channel-containing stacked element has a metal-oxide semiconductor structure, a quantum well structure, or a two-dimension electron gas structure, wherein the metal-oxide semiconductor structure consists of a metal layer, a high-dielectric-constant dielectric layer, and a group III-V channel layer; the quantum well structure consists of a large-energy-gap material layer, a small-energy-gap material layer functioning as a channel, and a large-energy-gap material layer; the two-dimension electron gas structure consists of a large-energy-gap heavily doped material layer, a large-energy-gap undoped material layer, a small-energy-gap undoped material layer functioning as a channel, and a moderate-energy-gap undoped material layer.

Furthermore, the material of the channel is InN, GaN, AlN, InP, InAs, InSb, GaAs, GaSb, or a compound consisting of them with different proportions.

Also, The present invention uses a film formation system selected from the group consisting of a metal organic chemical vapor deposition (MOCVD) system, a molecular beam epitaxy (MBE) system, an ultra-high vacuum chemical vapor deposition (UHVCVD) system and an atomic layer deposition (ALD) system to perform epitaxy.

The Effects of the Present Invention

A semiconductor device with group III-V channel and group IV source-drain manufactured according to the present invention has the following advantages: (1) the problems of insufficient energy level density and doping concentration are resolved; (2) channel carriers can be efficiently confined by forming a stacked structure such as a quantum well or two-dimension electron gas or metal-oxide semiconductor; (3) the integration of the group III-V material into a silicon germanium or silicon substrate can reduce cost; and (4) the group III-V channel grown with strain can further enhance the electrical properties since the group IV source-drain, such as $Si_xGe_{1-x}$ (x=0~1), with a relative small lattice constant can apply compressive strain to the group III-V channel, such as GaAs, with a relative large lattice constant while the group IV source-drain themselves are formed with tensile strain, wherein the compressive strain can increase electron mobility to increase current.

DESCRIPTION OF THE PREFERRED EMBODIMENTS

Hereinafter, the embodiments of the present invention will be described in detail with reference to drawings.

First Embodiment

A first embodiment uses a group III-V epitaxial technique to manufacture a metal-oxide semiconductor field effect transistor 1.

Figure 1:
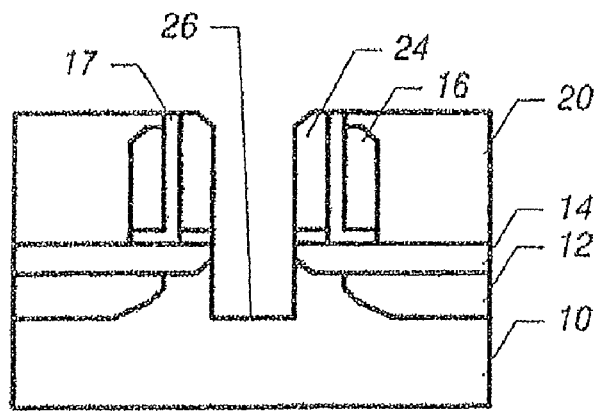
FIGS. 1~3 are schematic cross sectional views showing a transistor having abrupt source-drain and a metal gate of the related prior art.
Figure 2:
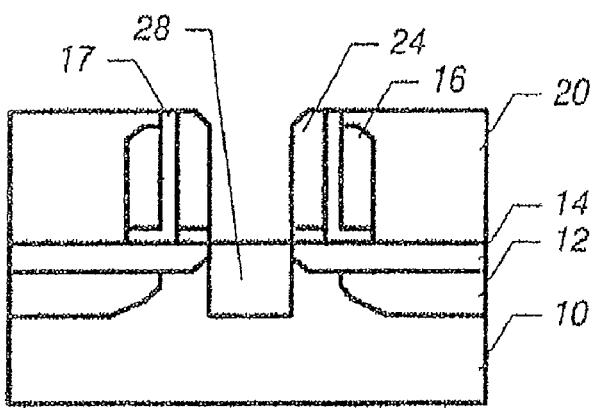
Figure 3:
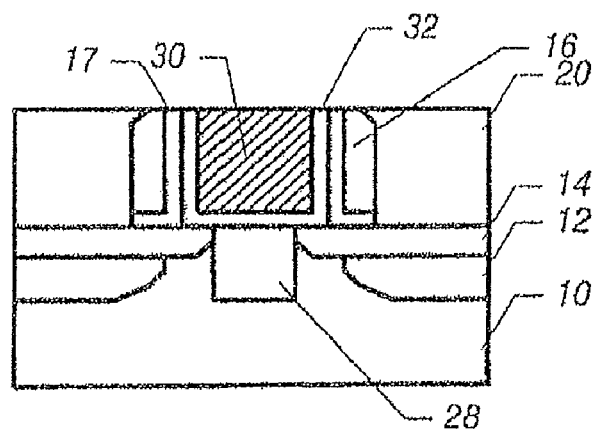
Figure 4:
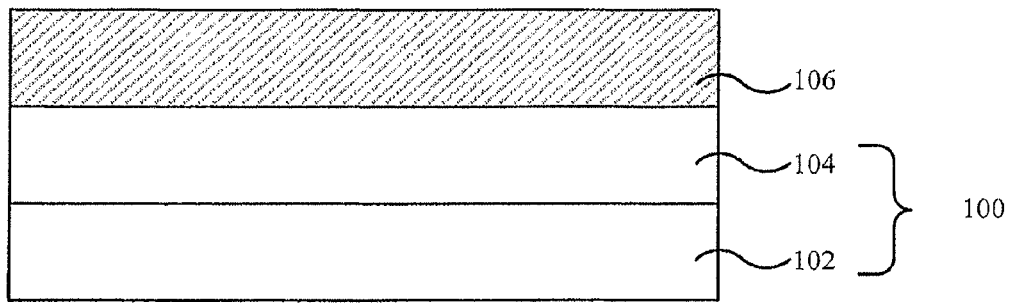
FIGS. 4~11 are schematic cross sectional views showing a metal-oxide semiconductor field effect transistor manufactured by using a group III-V epitaxy technique according to a first embodiment of the present invention.

Referring to FIG. 4, a p-type silicon substrate 102 with a p-type $Si_xGe_{1-x}$ (x=0~1) layer 104 formed thereon is prepared. Hereinafter, the p-type silicon substrate 102 together with the p-type $Si_xGe_{1-x}$ layer 104 are referred to as an $Si_xGe_{1-x}$ substrate 100. After cleaning, a first silicon dioxide layer 106 is deposited on the $Si_xGe_{1-x}$ substrate 100.

Figure 5:
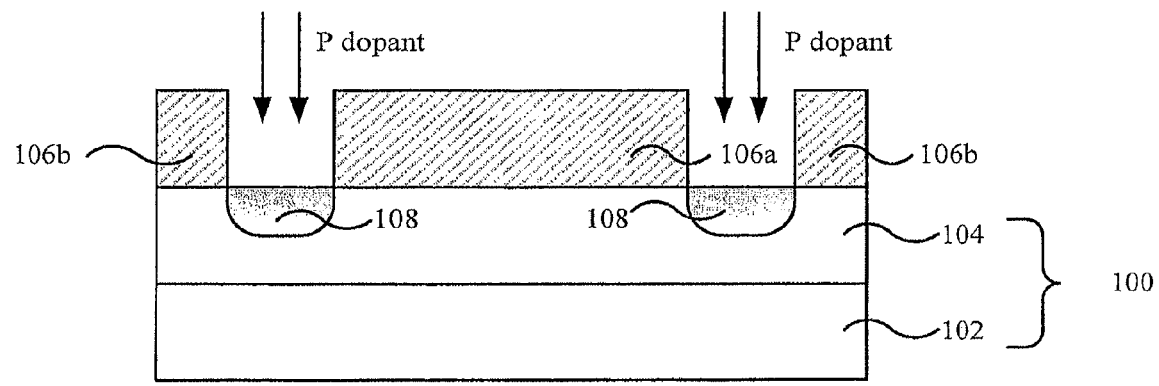
Figure 6:
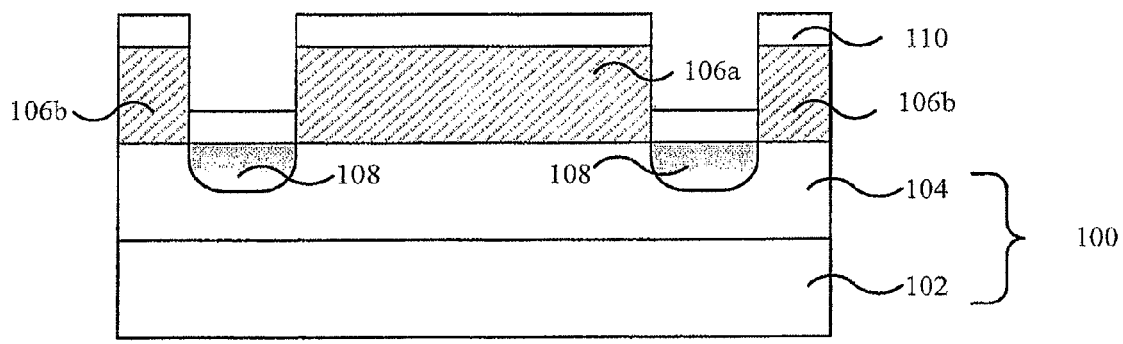

Referring to FIG. 5, a dummy gate 106a and a residual first silicon dioxide layer 106b are defined by using photolithography. The $Si_xGe_{1-x}$ substrate 100 is doped with P dopant by self-aligned ion implantation using the dummy gate 106a and the residual first silicon dioxide layer 106b as a mask, so as to form $n^+$ source-drain 108. Referring to FIG. 6, a second silicon dioxide layer 110 is deposited to cover the entire surface. Then, the $n^+$ source-drain 108 are activated at high temperature.

Figure 7:
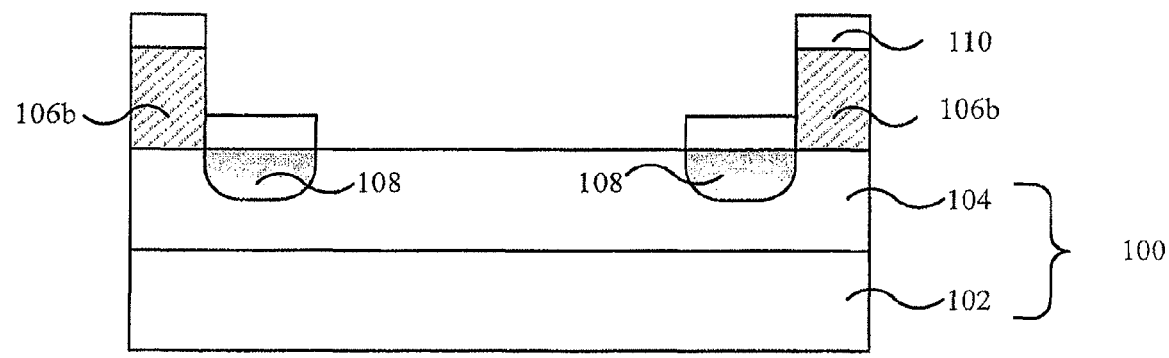

Referring to FIG. 7, the dummy gate 106a and the second silicon dioxide layer 110 above are removed by etching.

Figure 8:
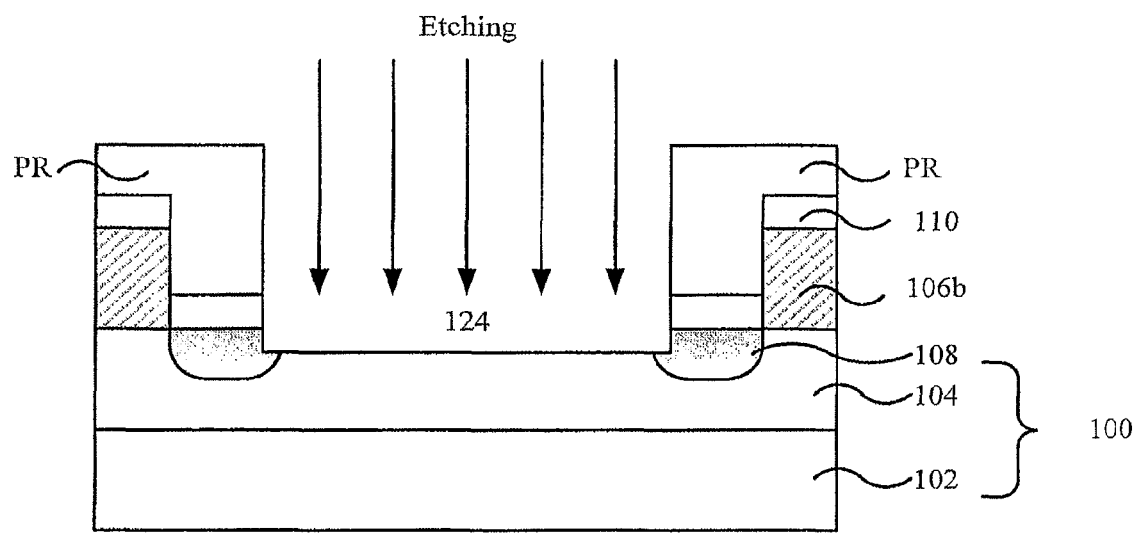

Referring to FIG. 8, a resist PR is formed on the residual second silicon dioxide layer 110 as an etching mask, and the $Si_xGe_{1-x}$ substrate 100 is etched to a desired depth, so as to form a recess 124.

Figure 9:
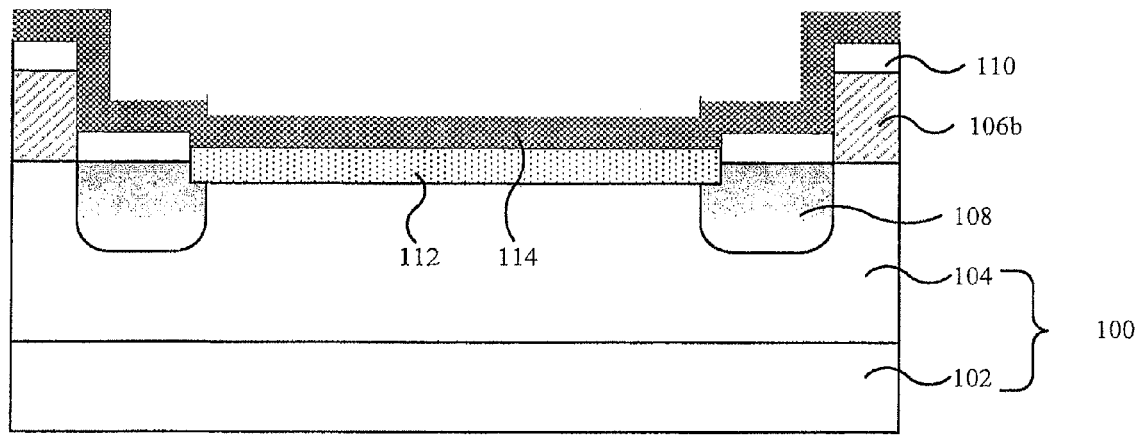

Referring to FIG. 9, the resist PR is removed. A group III-V channel layer having a high electron mobility 112 is formed with a group III-V material in the recess 124 by epitaxy. A high-dielectric-constant gate dielectric layer 114 is formed on the resultant structure.

Figure 10:
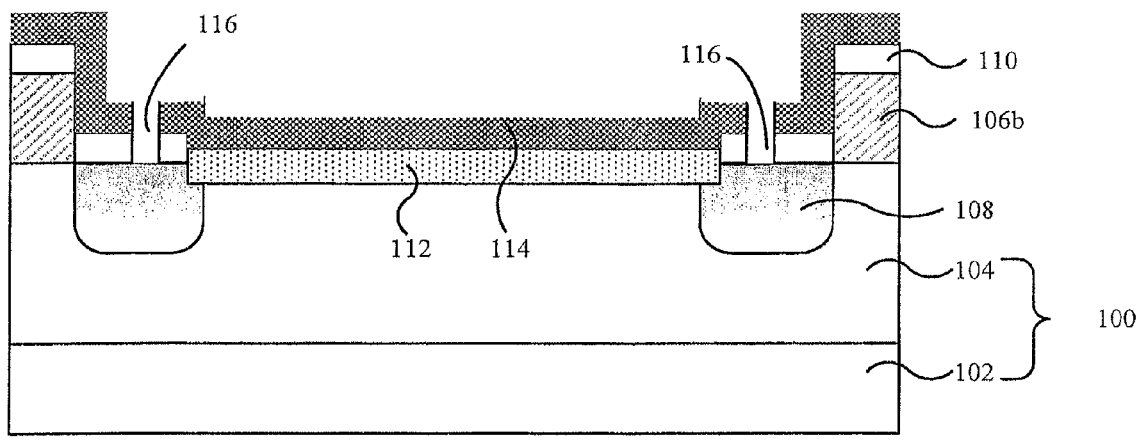

Referring FIG. 10, contact holes 116 are defined in the second silicon dioxide layer 110 and the high-dielectric-constant gate dielectric layer 114 above the n$^+$ source-drain 108.

Figure 11:
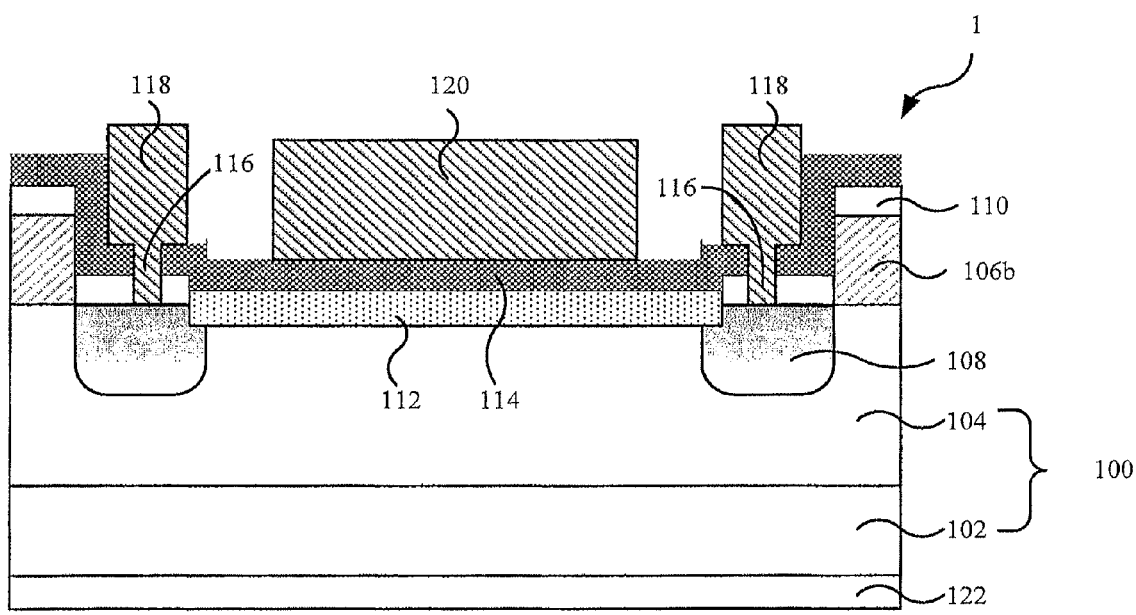

Referring to FIG. 11, source-drain plug contacts 118 made of TiN or TaN are formed in the contact holes 116 by metallization process, and a metal gate 120 made of TiN or TaN is formed on the high-electron-mobility group III-V channel layer 112. Finally, a backside contact 122 made of Al is formed on the side of the silicon substrate 102 opposite to the above-grown layers.

Second Embodiment

A second embodiment uses a group III-V epitaxial technique to manufacture a quantum well field effect transistor (QWFET) 2.

Figure 12:
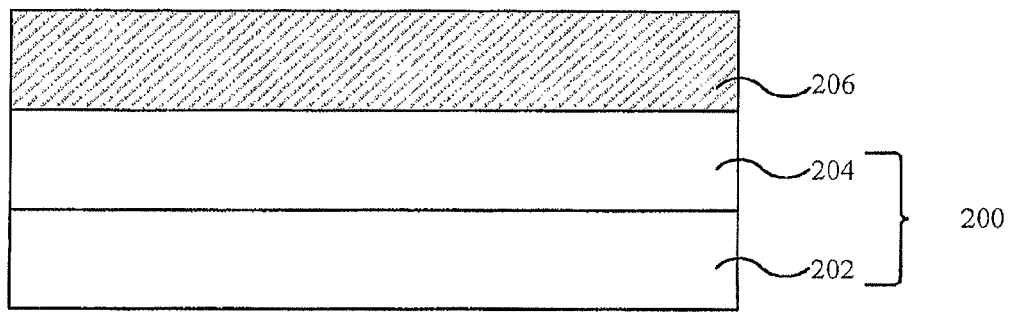
FIGS. 12~19 are schematic cross sectional views showing a quantum well field effect transistor manufactured by using a group III-V epitaxy technique according to a second embodiment of the present invention.

Referring to FIG. 12, a p-type silicon substrate 202 with a p-type $Si_xGe_{1-x}$ (x=0~1) layer 204 formed thereon is prepared. Hereinafter, the p-type silicon substrate 202 together with the p-type $Si_xGe_{1-x}$ layer 204 are referred to as an $Si_xGe_{1-x}$ substrate 200. After cleaning, a first silicon dioxide layer 206 is deposited on the $Si_xGe_{1-x}$ substrate 200.

Figure 13:
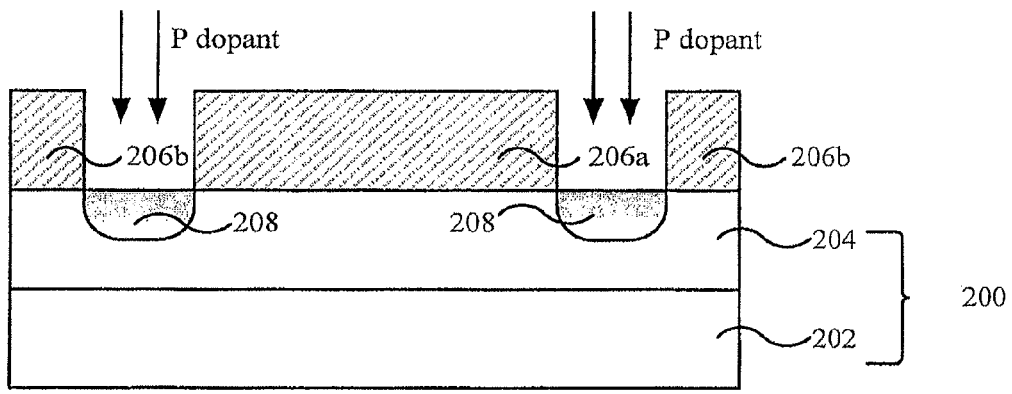
Figure 14:
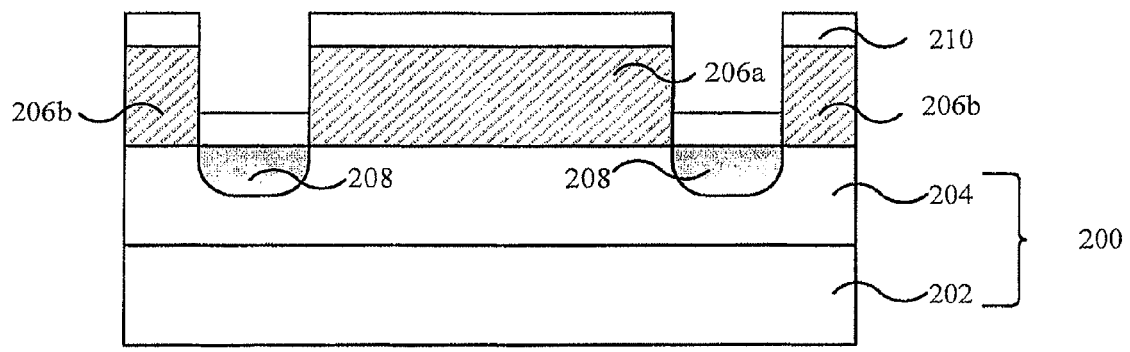

Referring to FIG. 13, a dummy gate 206a and a residual first silicon dioxide layer 206b are defined by using photolithography. The $Si_xGe_{1-x}$ substrate 200 is doped with P dopant by self-aligned ion implantation using the dummy gate 206a and the residual first silicon dioxide layer 206b as a mask, so as to form n$^+$ source-drain 208. Referring to FIG. 14, a second silicon dioxide layer 210 is deposited to cover the entire surface. Then, the n$^+$ source-drain 208 are activated at high-temperature.

Figure 15:
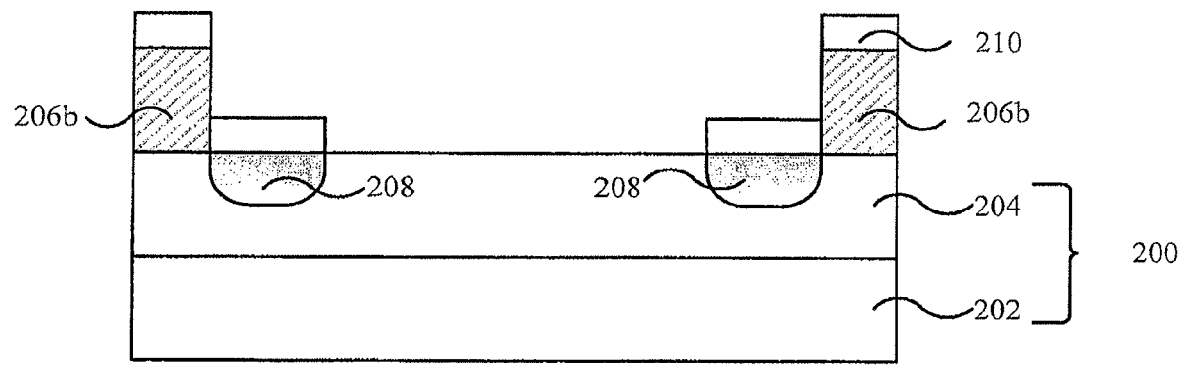

Referring to FIG. 15, the dummy gate 206a and the second silicon dioxide layer 210 above are removed by etching.

Figure 16:
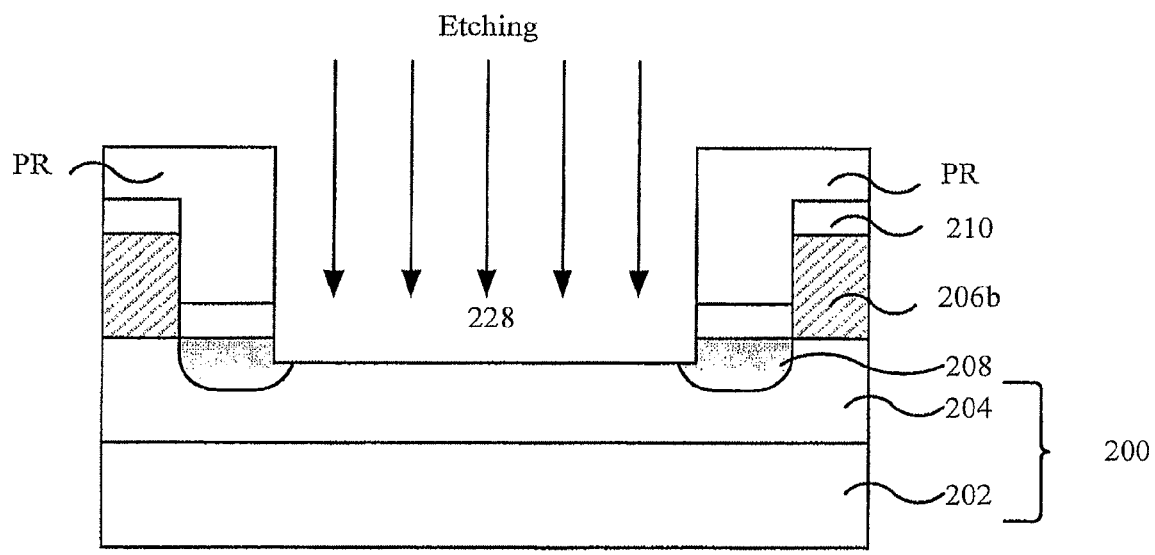

Referring to FIG. 16, a resist PR is formed on the residual second silicon dioxide layer 210 as an etching mask, and the $Si_xGe_{1-x}$ substrate 200 is etched to a depth required for a subsequent stacked element, so as to form a recess 228.

Figure 17:
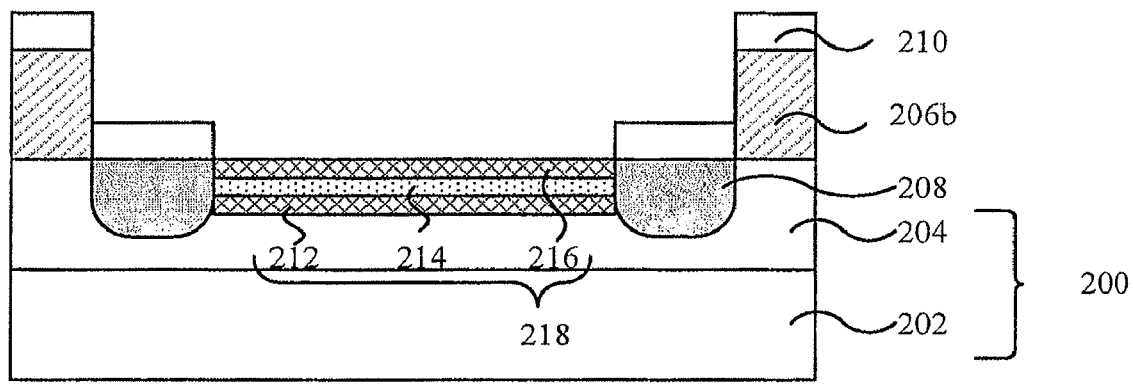

Referring to FIG. 17, the resist PR is removed. A group III-V first large-energy-gap confinement layer 212, a group III-V small-energy-gap channel layer 214, and a group III-V second large-energy-gap confinement layer 216 are sequentially formed in the recess 228 as a stacked element having a group III-V quantum well structure 218 by epitaxy.

Figure 18:
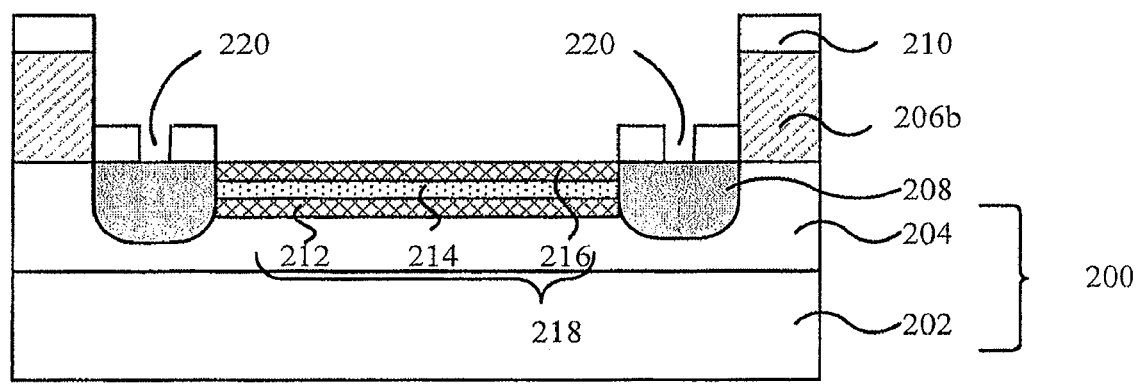

Referring to FIG. 18, contact holes 220 are defined in the second silicon dioxide layer 210 above the n$^+$ source-drain 208.

Figure 19:
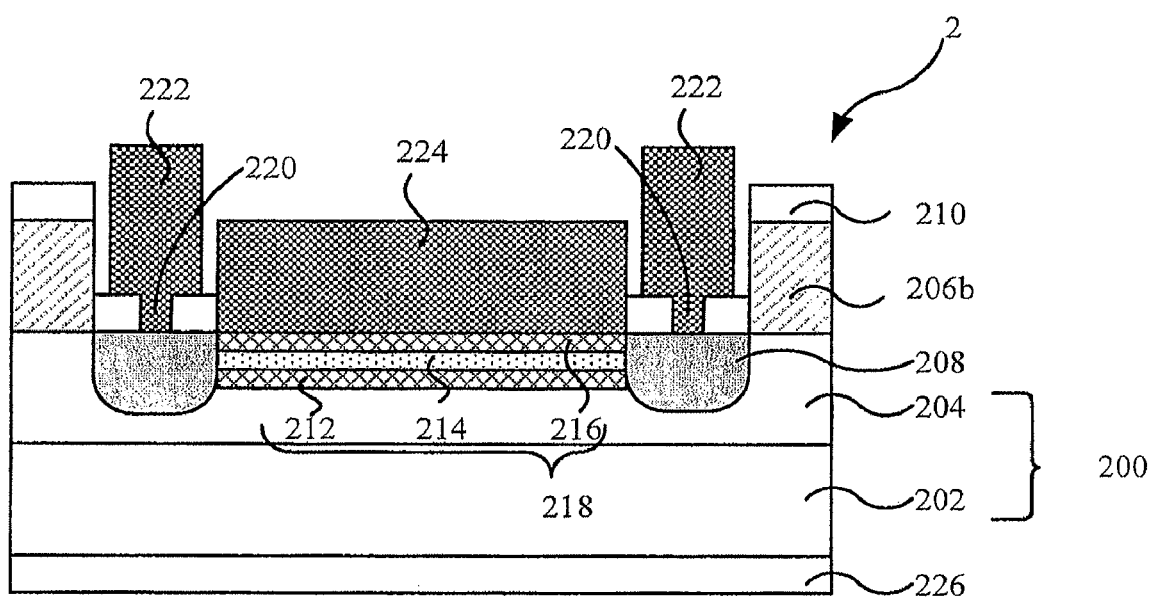

Referring to FIG. 19, source-drain plug contacts 222 made of Al are formed in the contact holes 220 by metallization process. A metal gate 224 made of Pt or Ti is formed on the stacked element having a group III-V quantum well structure 218. Finally, a backside contact 226 made of Al is formed on the side of the silicon substrate 202 opposite to the above-grown layers.

Third Embodiment

A third embodiment uses a group III-V epitaxial technique to manufacture a high-electron-mobility transistor (HEMT) 3.

Figure 20:
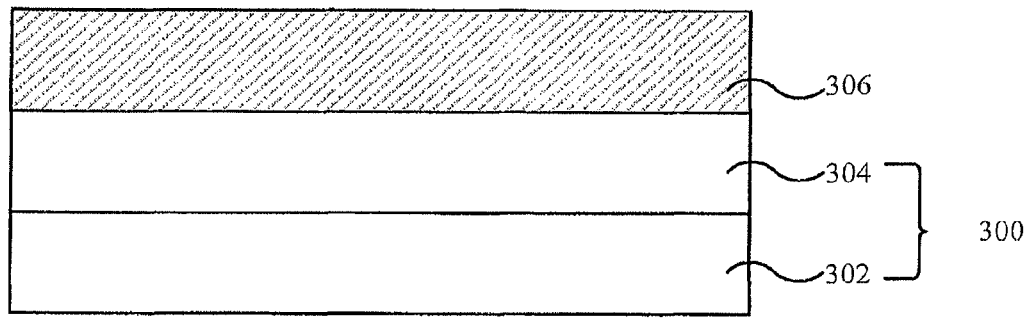
FIGS. 20~27 are schematic cross sectional views showing a high-electron-mobility transistor manufactured by using a group III-V epitaxy technique according to a third embodiment of the present invention.

Referring to FIG. 20, a p-type silicon substrate 302 with a p-type $Si_xGe_{1-x}$ (x=0~1) layer 304 formed thereon is prepared. Hereinafter, the p-type silicon substrate 302 together with the p-type $Si_xGe_{1-x}$ layer 304 are referred to as an $Si_xGe_{1-x}$ substrate 300. After cleaning, a first silicon dioxide layer 306 is deposited on the $Si_xGe_{1-x}$ substrate 300.

Figure 21:
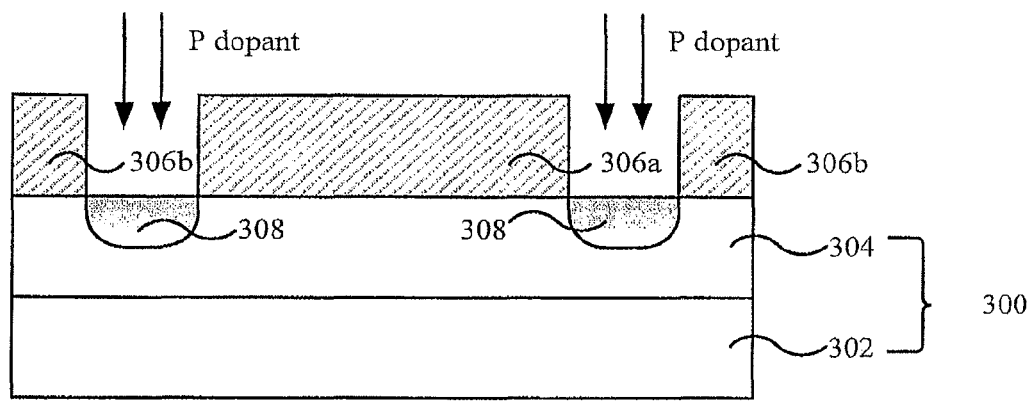
Figure 22:
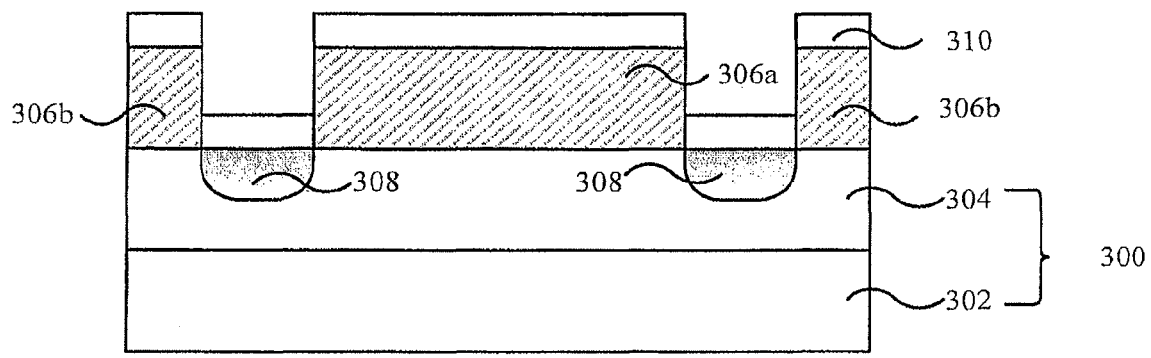

Referring to FIG. 21, a dummy gate 306a and a residual first silicon dioxide layer 306b are defined by using photolithography. The $Si_xGe_{1-x}$ substrate 300 is doped with P dopant by self-aligned ion implantation using the dummy gate 306a and the residual first silicon dioxide layer 306b as a mask, so as to form n$^+$ source-drain 308. Referring to FIG. 22, a second silicon dioxide layer 310 is deposited to cover the entire surface. Then, the n$^+$ source-drain 308 are activated at high temperature.

Figure 23:
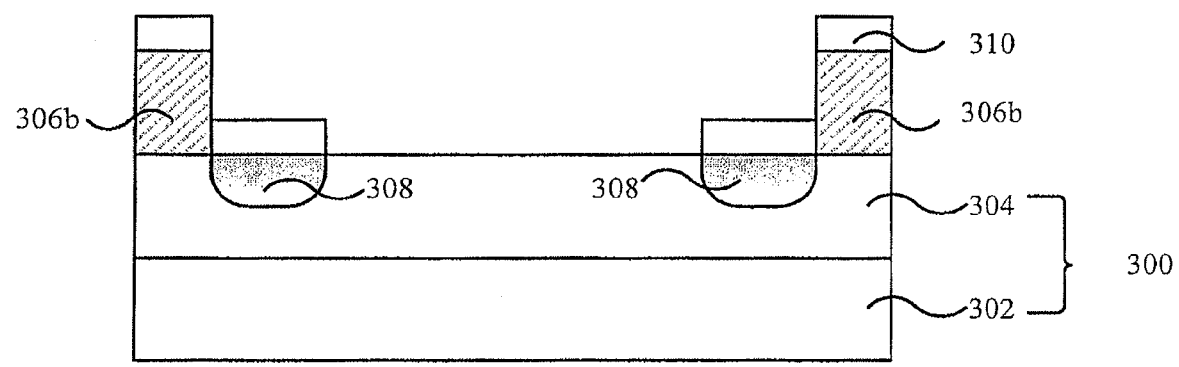

Referring to FIG. 23, the dummy gate 306a and the second silicon dioxide layer 310 above are removed by etching.

Figure 24:
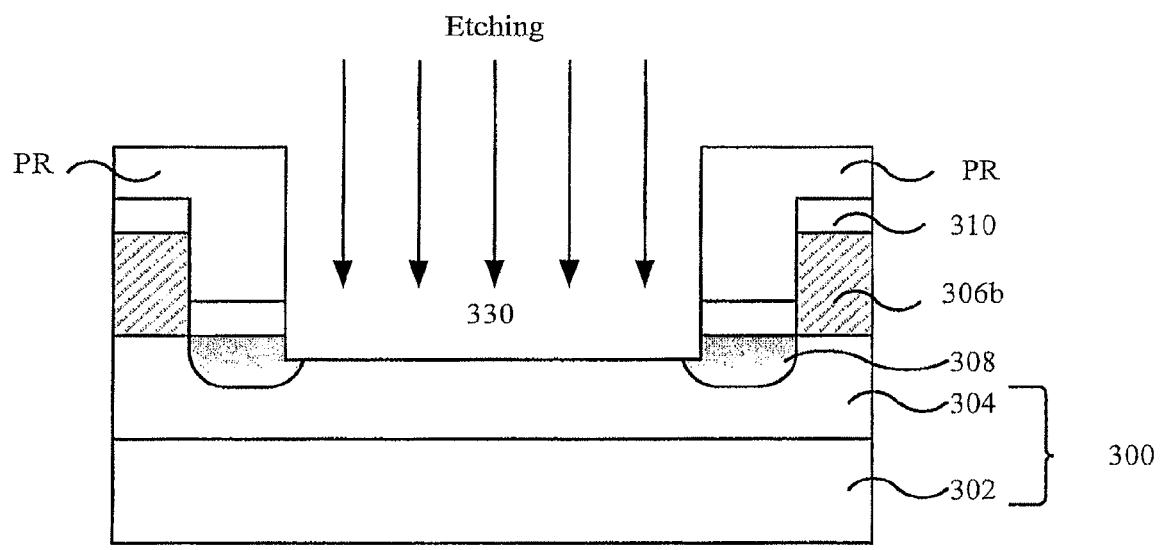

Referring to FIG. 24, a resist PR is formed on the residual second silicon dioxide layer 310 as an etching mask, and the $Si_xGe_{1-x}$ substrate 300 is etched to a depth required for a subsequent stacked element, so as to form a recess 330.

Figure 25:
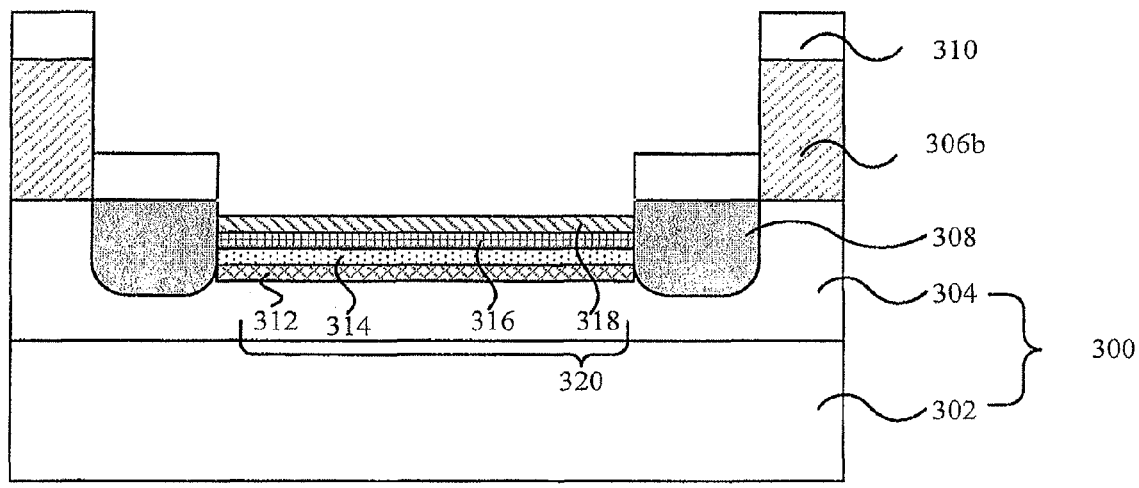
Figure 26:
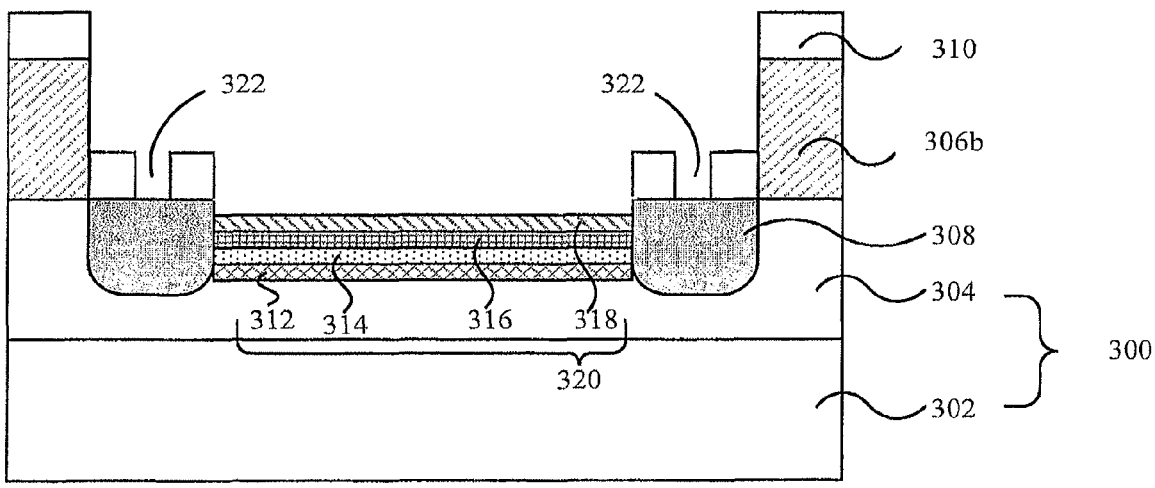

Referring to FIG. 25, the resist PR is removed. A group III-V undoped moderate-energy-gap confinement layer 312, a group III-V undoped small-energy-gap channel layer 314, a group III-V undoped large-energy-gap spacer layer 316, and a group III-V n$^+$-doped large-energy-gap confinement layer 318 are sequentially formed in the recess 330 as a stacked element having a group III-V two-dimension electron gas structure 320 by epitaxy. Referring to FIG. 26, contact holes 322 are defined in the residual second silicon dioxide layer 310 above the source-drain 308.

Figure 27:
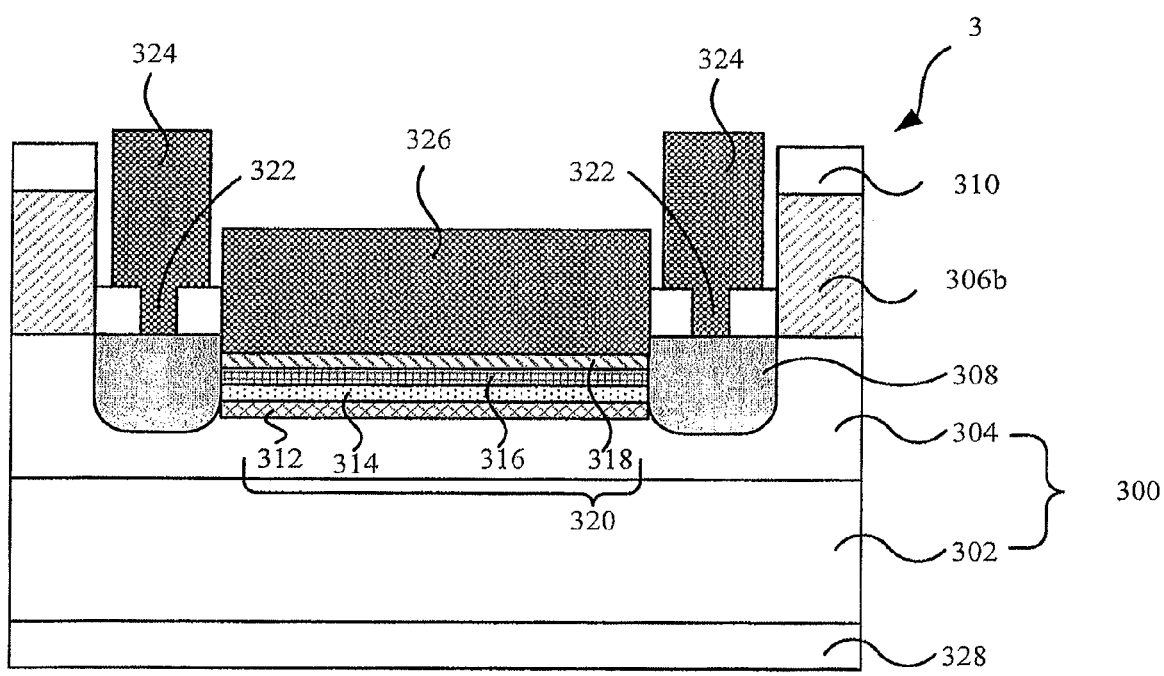

Referring to FIG. 27, source-drain plug contacts 324 are formed in the contact holes 322 by metallization process. A metal gate 326 is formed on the stacked element having a group III-V two-dimension electron gas structure 320. Finally, a backside contact 328 made of Al is formed on the side of the silicon substrate 302 opposite to the above-grown layers.

Fourth Embodiment

A fourth embodiment uses a group III-V epitaxial technique to manufacture an MOS high-electron-mobility transistor (MOS-HEMT) 4.

Figure 28:
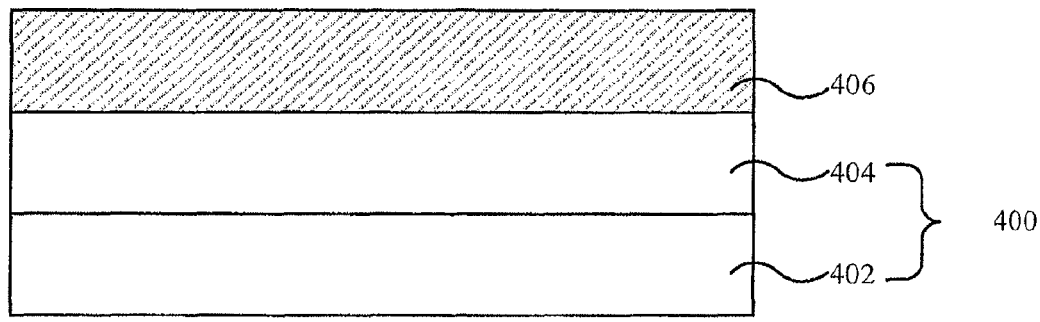
FIGS. 28~35 are schematic cross sectional views showing a metal-oxide semiconductor high-electron-mobility transistor manufactured by using a group III-V epitaxy technique according to a fourth embodiment of the present invention.

Referring to FIG. 28, a silicon substrate 402 with an $Si_xGe_{1-x}$ (x=0~1) layer 404 formed thereon is prepared. Hereinafter, the silicon substrate 402 together with the $Si_xGe_{1-x}$ layer 404 are referred to as an $Si_xGe_{1-x}$ substrate 400. After cleaning, a first silicon dioxide layer 406 is deposited on the $Si_xGe_{1-x}$ substrate 400.

Figure 29:
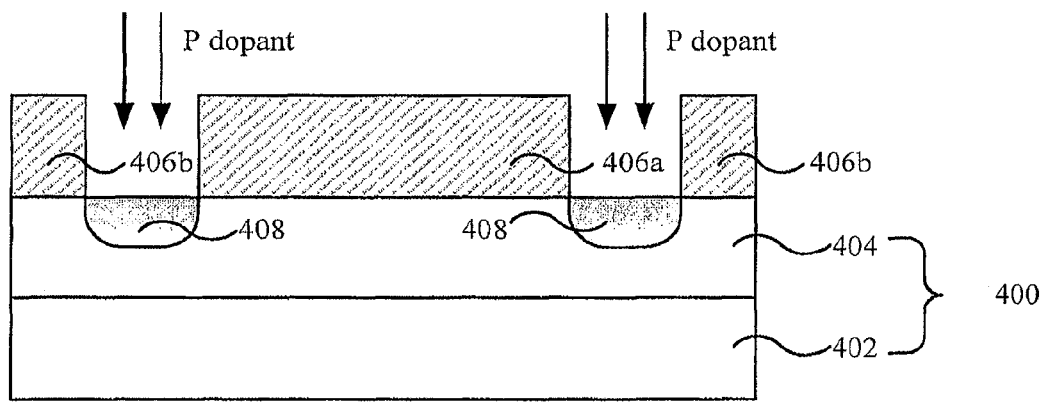
Figure 30:
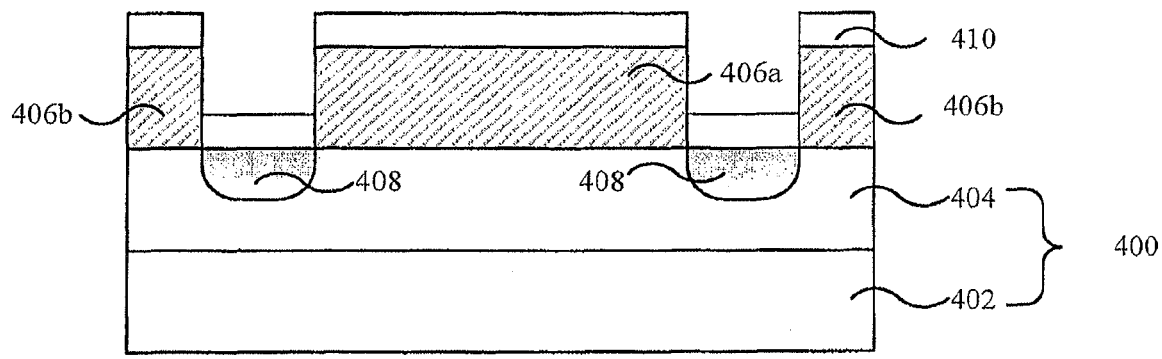

Referring to FIG. 29, a dummy gate 406a and a residual first silicon dioxide layer 406b are defined by using photolithography. The $Si_xGe_{1-x}$ substrate 400 is doped with P dopant by self-aligned ion implantation using the dummy gate 406a and the residual first silicon dioxide layer 406b as a mask, so as to form n$^+$ source-drain 408. Referring to FIG. 30, a second silicon dioxide layer 410 is deposited to cover the entire surface. Then, the source-drain 408 are activated at high temperature.

Figure 31:
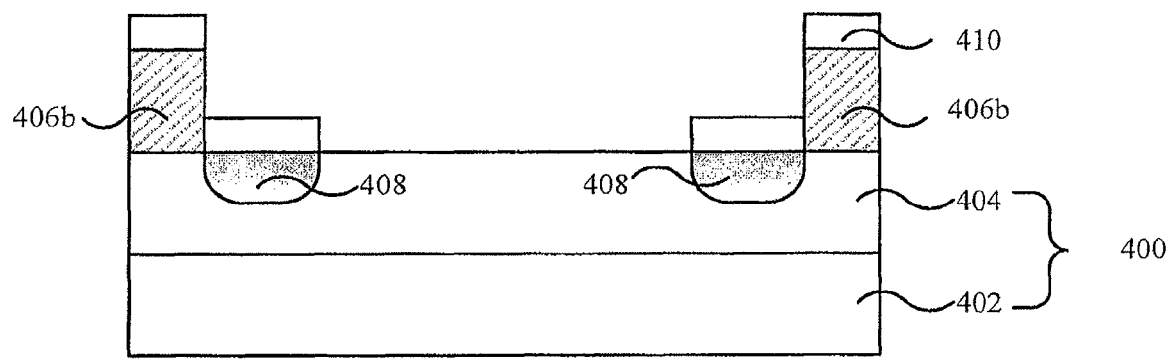

Referring to FIG. 31, the dummy gate 406a and the second silicon dioxide layer 410 above are removed by etching.

Figure 32:
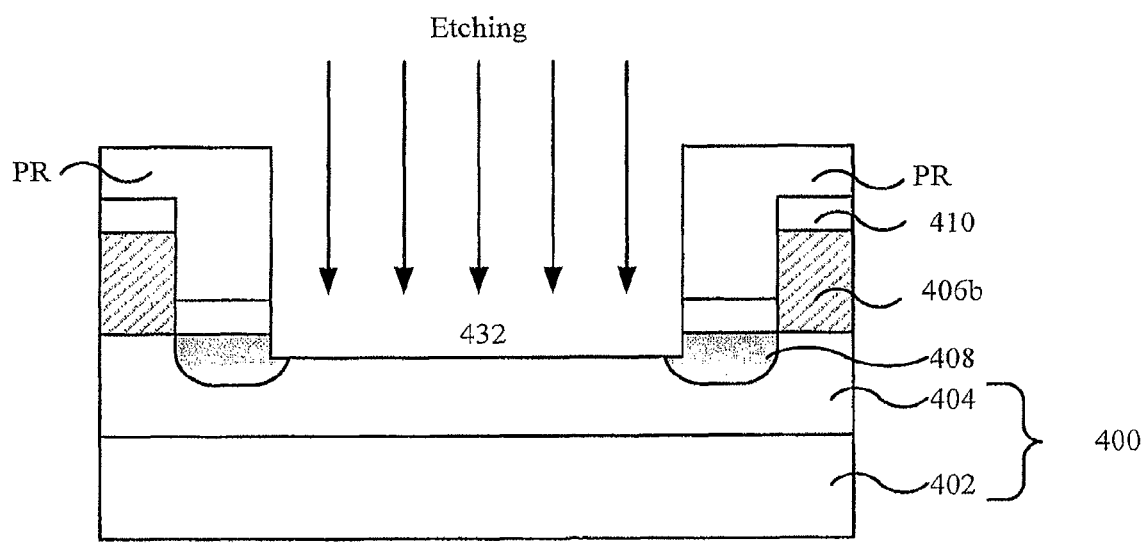

Referring to FIG. 32, a resist PR is formed on the residual second silicon dioxide layer 410 as an etching mask, and the $Si_xGe_{1-x}$ substrate 400 is etched to a depth required for a subsequent stacked element, so as to form a recess 432.

Figure 33:
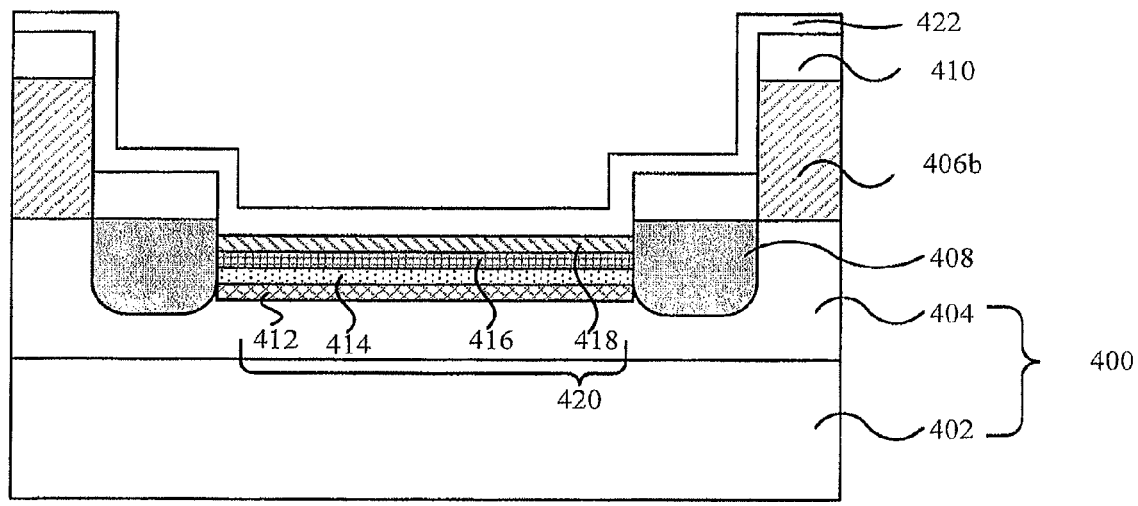
Figure 34:
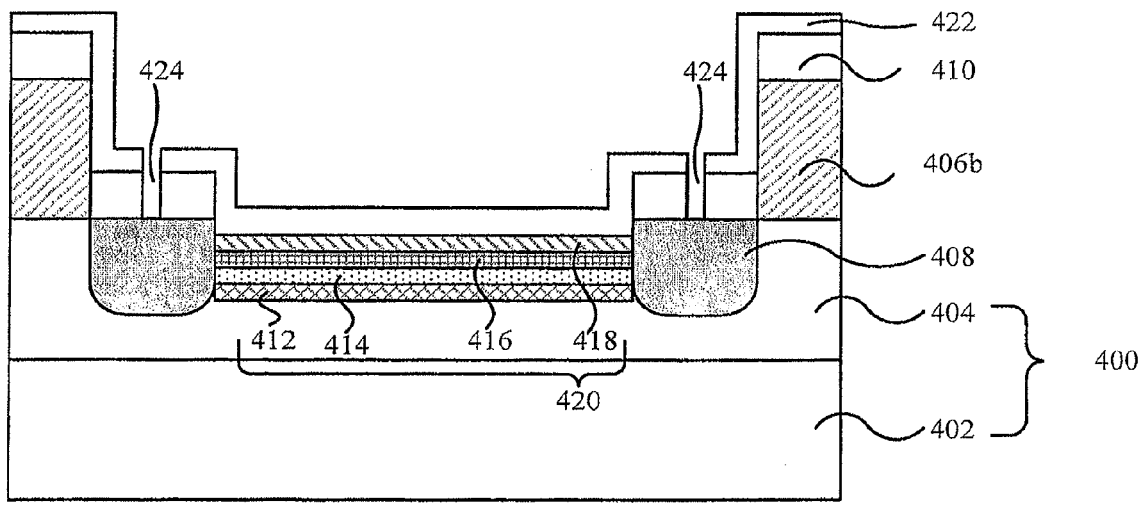

Referring to FIG. 33, the resist PR is removed. A group III-V undoped moderate-energy-gap confinement layer 412, a group III-V undoped small-energy-gap channel layer 414, a group III-V undoped large-energy-gap spacer layer 416, and a group III-V n$^+$-doped large-energy-gap confinement layer 418 are sequentially formed in the recess 432 as a stacked element having a group III-V two-dimension electron gas structure 420 by epitaxy. A high-dielectric-constant gate dielectric layer 422 is formed on the stacked element having a group III-V two-dimension electron gas structure 420. Referring to FIG. 34, contact holes 424 are defined in the second silicon dioxide layer 410 and high-dielectric-constant gate dielectric layer 422 above the n⁺ source-drain 408.

Figure 35:
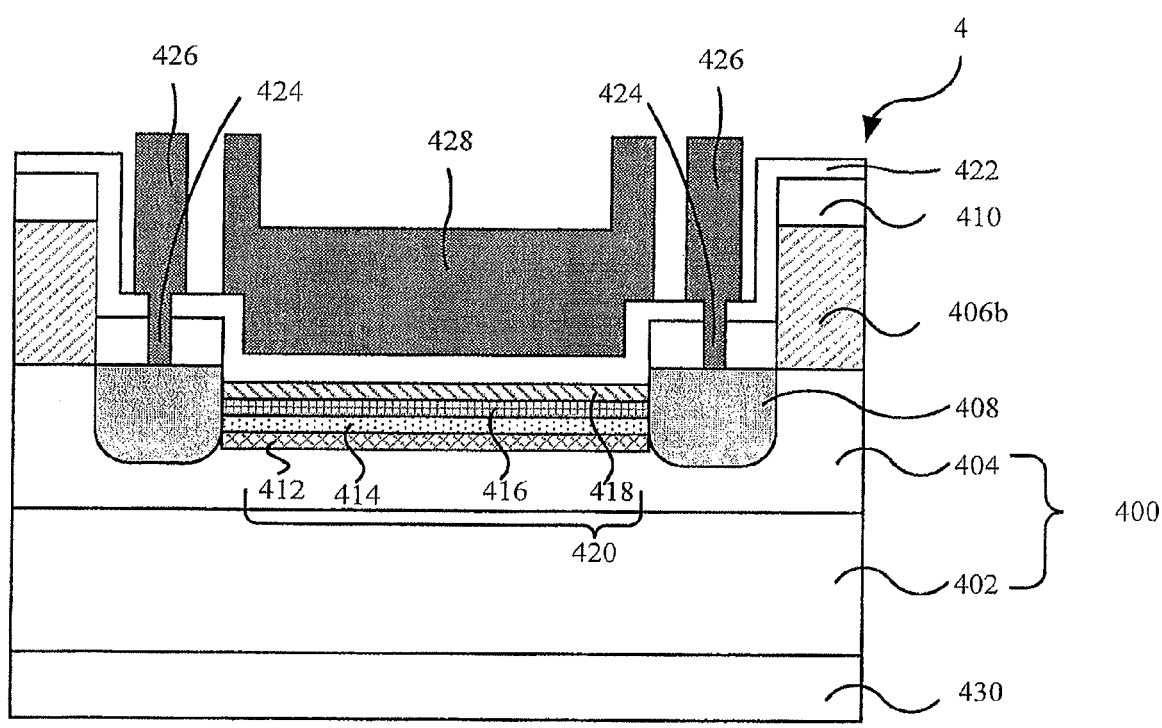

Referring to FIG. 35, source-drain plug contacts 426 are formed in the contact holes 424 by metallization process. A metal gate 428 is formed on the group III-V two-dimension electron gas structure 420. Finally, a backside contact 430 made of Al is formed on the side of the silicon substrate 402 opposite to the above-grown layers.

Fifth Embodiment

A fifth embodiment uses a group IV epitaxial technique to manufacture a quantum well field effect transistor 5.

Figure 36:
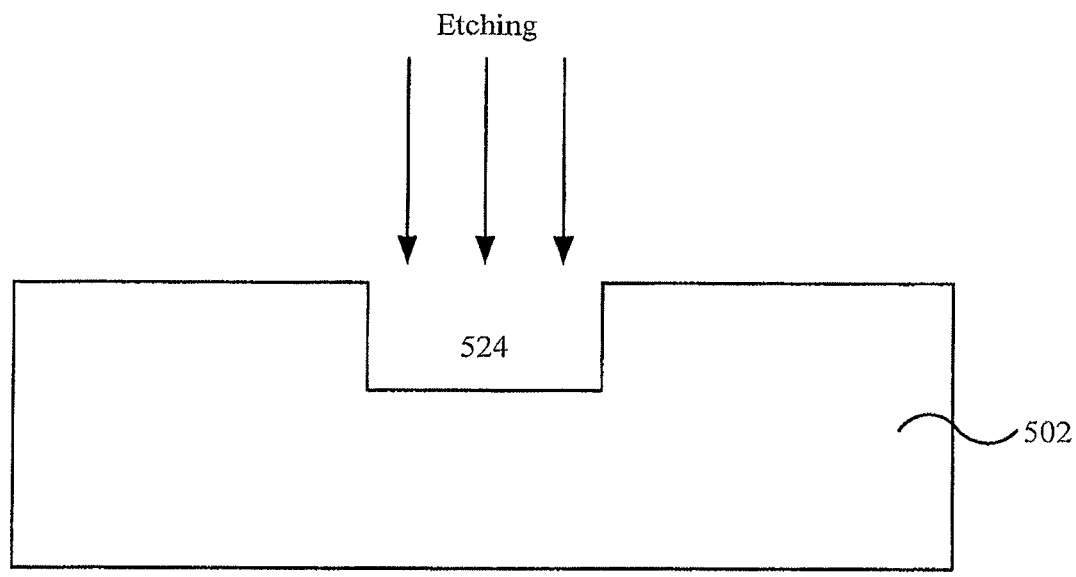
FIGS. 36~44 are schematic cross sectional views showing a quantum well field effect transistor manufactured by using a group IV epitaxy technique according to a fifth embodiment of the present invention.

A group III-V substrate 502, such as GaAs, is prepared. Referring to FIG. 36, the group III-V substrate 502 is etched to a depth required for a subsequent stacked element, so as to form a recess 524.

Figure 37:
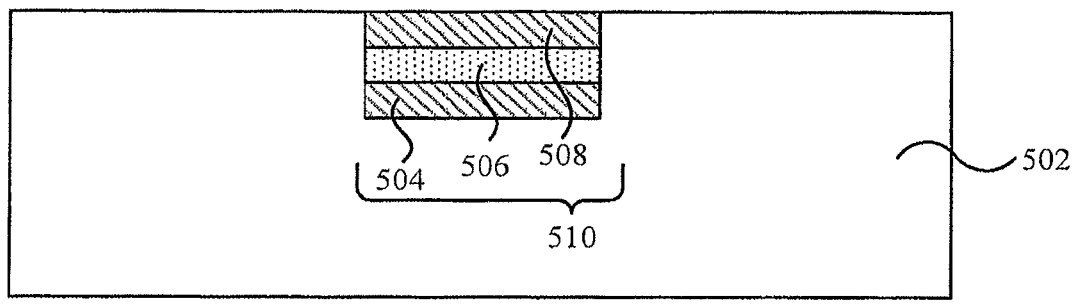

Referring to FIG. 37, a group III-V first large-energy-gap confinement layer 504, a group III-V small-energy-gap channel layer 506, and a group III-V second large-energy-gap confinement layer 508 are sequentially formed in the recess 524 as a stacked element having a group III-V quantum well structure 510 by epitaxy.

Figure 38:
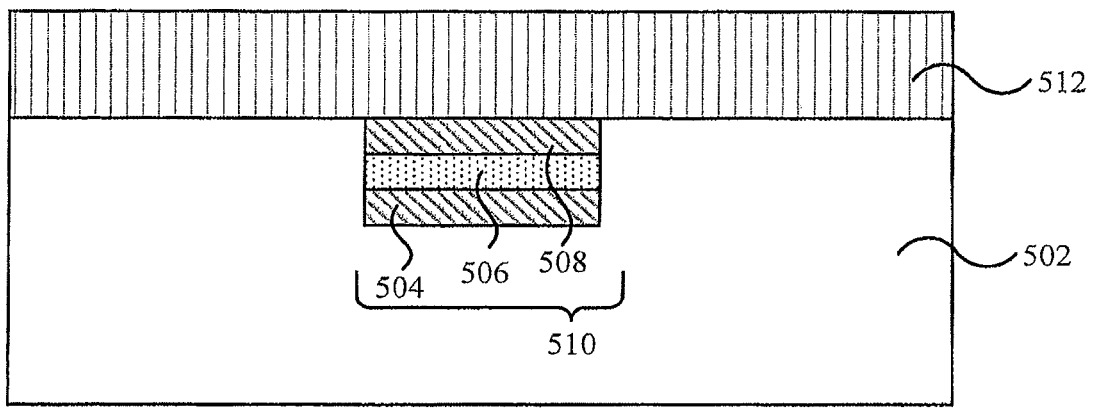
Figure 39:
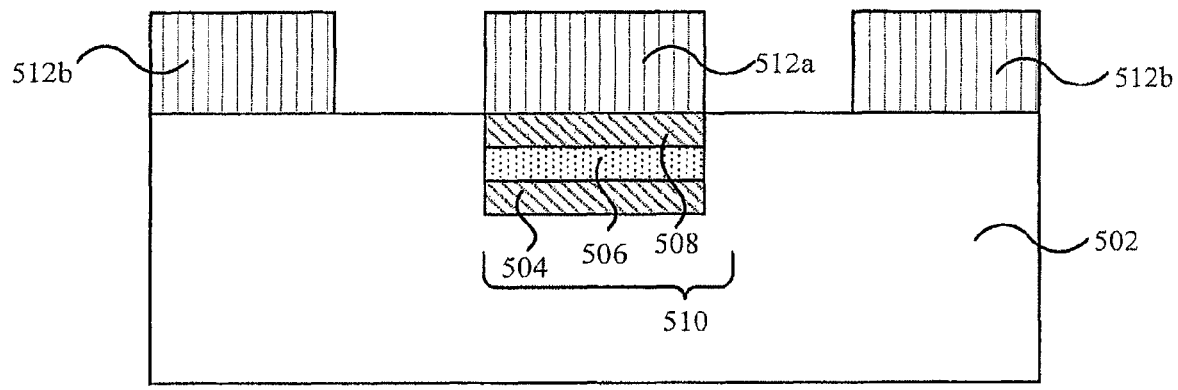
Figure 40:
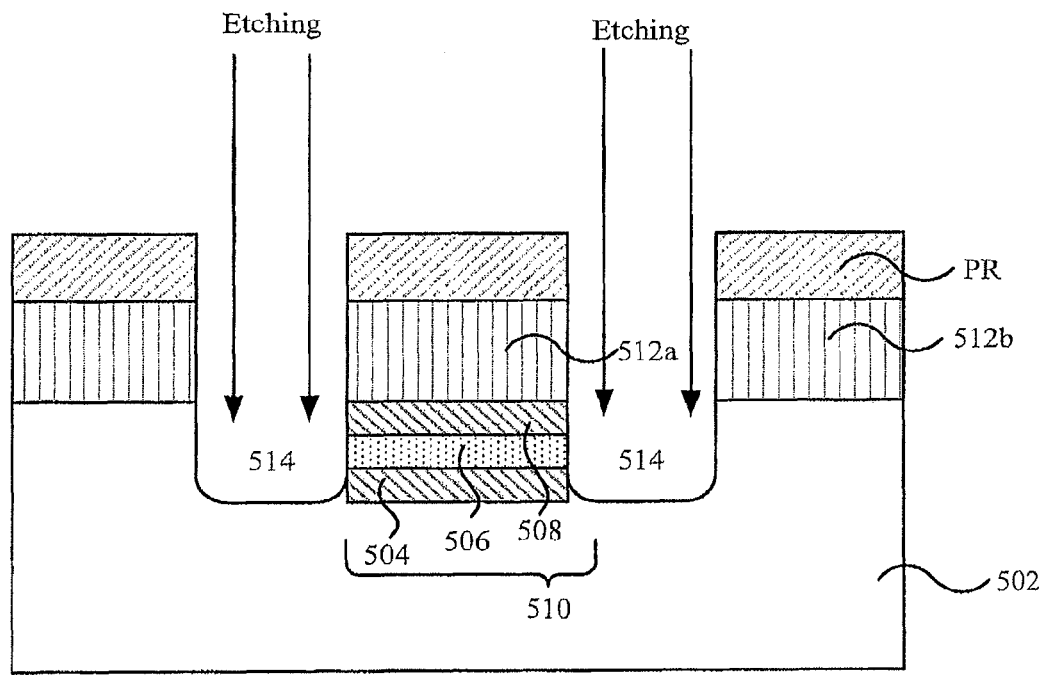

Referring to FIG. 38, a silicon oxide layer 512 is deposited to cover the entire surface. Referring to FIG. 39, a dummy gate 512a and a residual silicon dioxide layer 512b are defined by using photolithography. Referring to FIG. 40, a resist PR is formed on the dummy gate 512a and the residual silicon dioxide layer 512b as an etching mask, and the exposed part of the group III-V substrate 502 is etched to form a source-drain recess 514.

Figure 41:
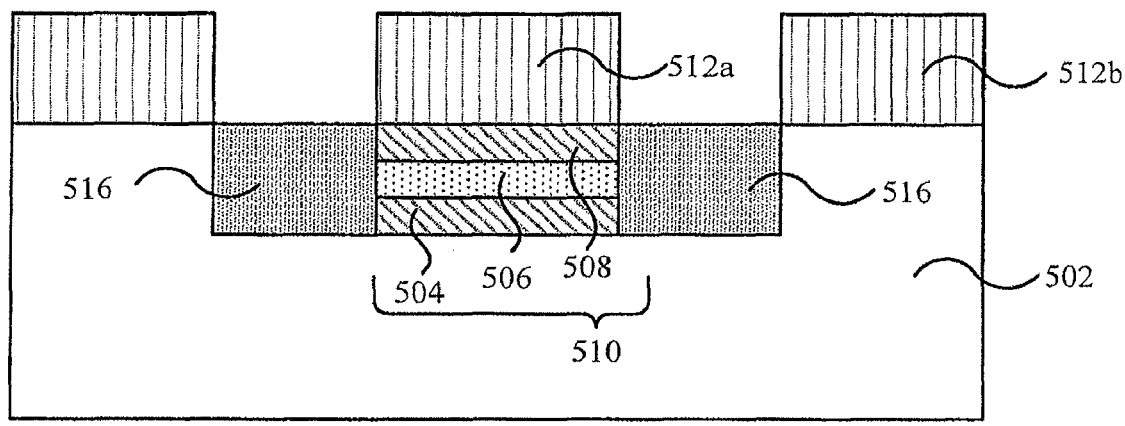
Figure 42:
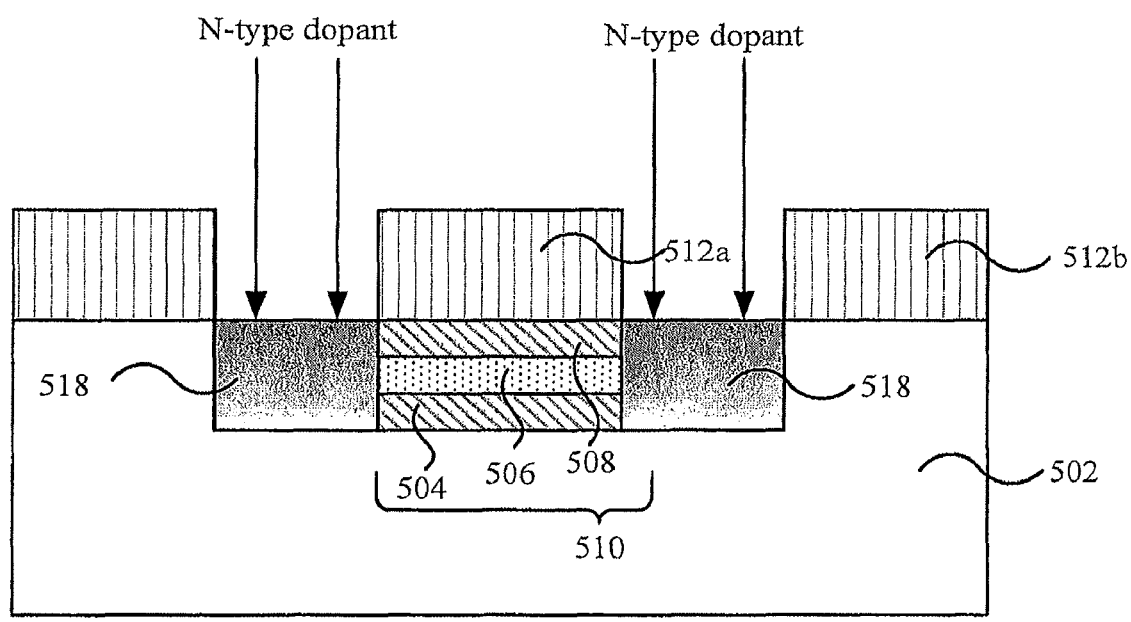

Referring to FIGS. 41~42, the resist is removed. The source-drain recess 514 is filled with a group IV SiGe material 516 by selective heteroepitaxy. The group IV SiGe material 516 is N-type doped by self-aligned ion implantation using the dummy gate 512a and the residual silicon dioxide layer 512b as a mask, so as to form source-drain 518. Then, the source-drain 518 is activated at high temperature.

Figure 43:
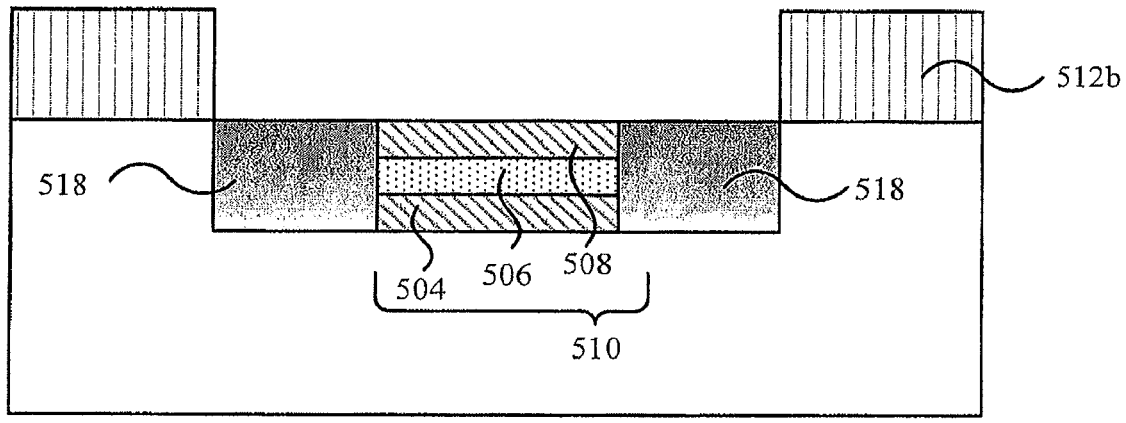
Figure 44:
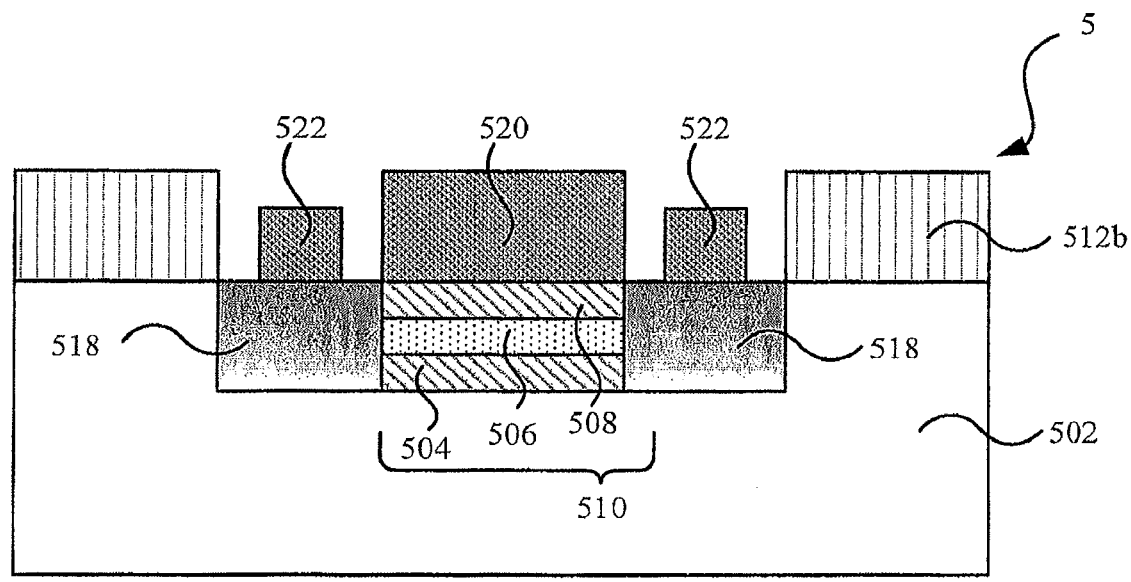

Referring to FIG. 43, the dummy gate 512a is removed. Referring to FIG. 44, a metal gate 520 is formed on the group III-V quantum well structure 510. Source-drain contacts 522 are formed on the source-drain 518.

Simulation Results of Electrical Properties

Hereinafter, the electrical properties of a field effect transistor having a group III-V channel and group IV source-drain is simulated by using ISE-TCAD simulation software, so as to evaluate the effect of the prevent invention. Here, the field effect transistor according to the present invention, to be evaluated, has a GaAs channel in cooperation with a Ge source-drain structure, as shown in an appendix, and is used to compare with GaAs n-MOSFET and prior Si n-MOSFET. The main difference among the three FETs is the doping concentration of source-drain. The constituent and doping conditions are listed in Table 1.

TABLE 1

| Device Structure | GaAs MOSFET with Germanium Source-drain | GaAs MOSFET | Si MOSFET | Note |
|---|---|---|---|---|
| Substrate(GaAs, Si) | p-type, $5 \times 10^{17}$ cm$^{-3}$ | | | Thickness = 1 µm |
| Gate Dielectric | HfO$_2$, 5 nm(EOT = 1 nm) | | | |
| Gate Material | Al Metal(work function = 4.1 eV) | | | |
| Spacer | SiO$_2$, length = 50 nm | | | |
| Source-drain Material | Ge ($6 \times 10^{19}$ cm$^{-3}$) | GaAs ($1 \times 10^{19}$ cm$^{-3}$) | Si ($1 \times 10^{20}$ cm$^{-3}$) | Gaussian dopant profile |
| Source-drain Junction Extension | Depth = 40 nm | | | |
| Source-drain Junction | Depth = 80 nm | | | |
| Halo Implantation | p-type, $2 \times 10^{18}$ cm$^{-3}$ | | | Gaussian dopant profile |

Figure 45:
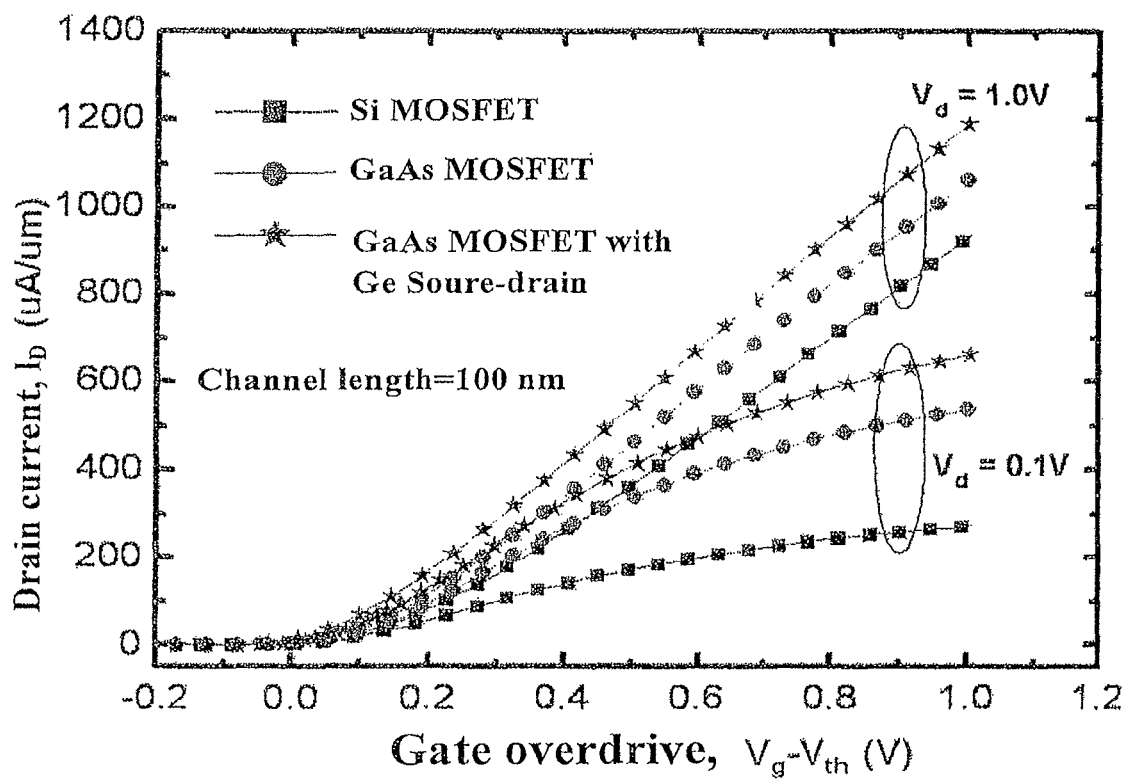
FIGS. 45-47 are graphs showing the electrical properties $I_D$-$V_G$, $G_M$-$V_G$, and $I_D$-$V_D$ of three kinds of MOSFETs listed in Table 1, respectively.
Figure 46:
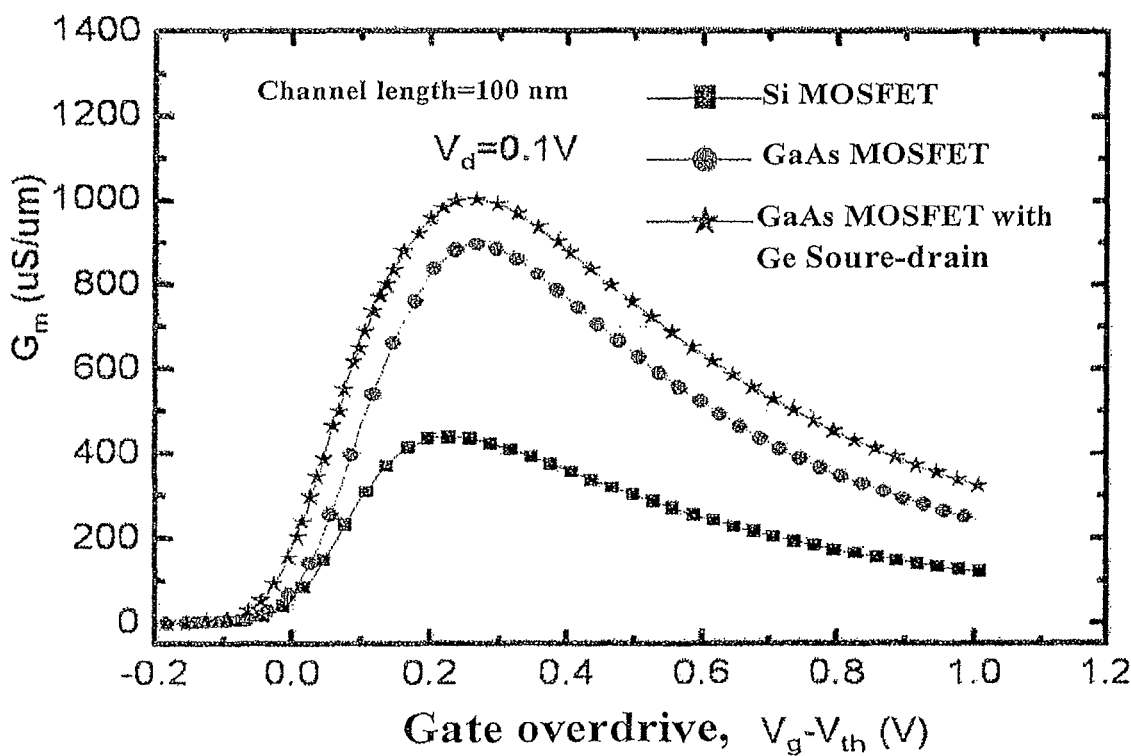
Figure 47:
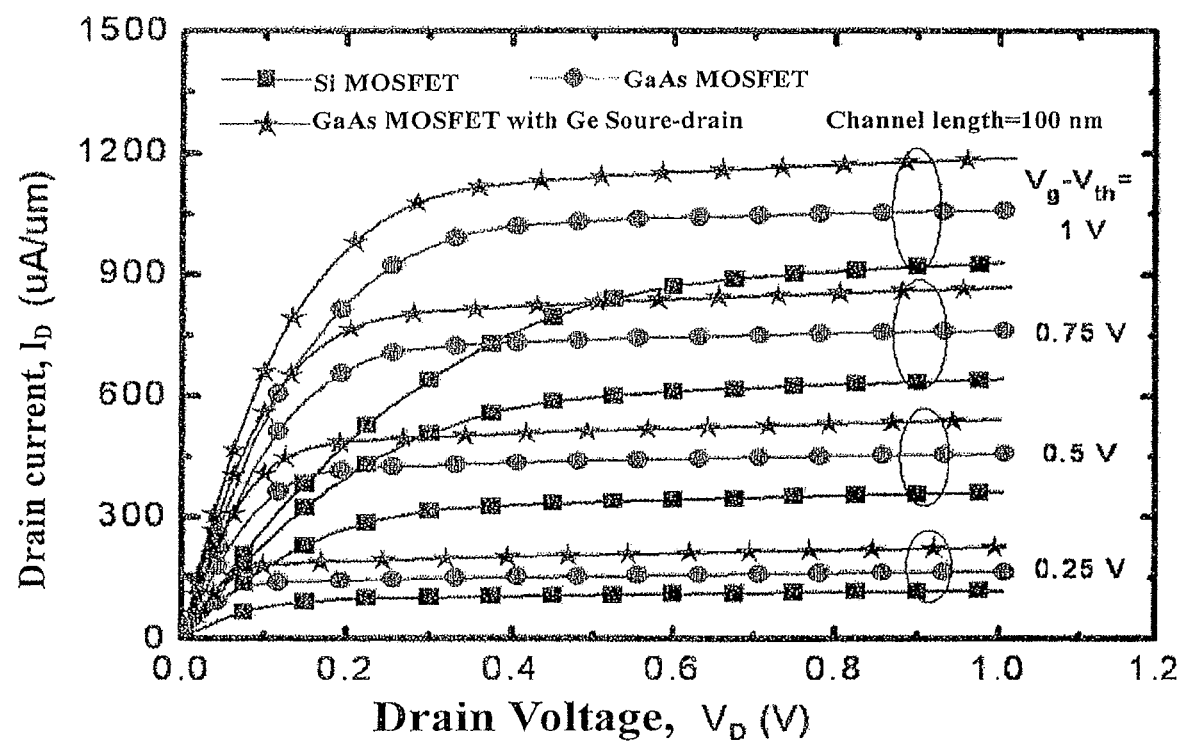

FIGS. 45~47 are graphs showing the electrical properties $I_D$-$V_G$, $G_M$-$V_G$, and $I_D$-$V_D$ of three kinds of MOSFETs listed in Table 1, respectively. Here, the simulated channel size is 100 nm. As can be seen from FIGS. 45 and 46, the MOSFET with a high-carrier-mobility group III-V channel can be used to efficiently enhance the characteristics of driving current and conductance, and the GaAs n-MOSFET with Ge source-drain can further improve the whole device characteristics. For convenient comparison, the electrical properties of three kinds of MOSFETs listed in Table 1, shown in FIGS. 45-47, are summarized in Table 2.

TABLE 2

| | $G_M$(µS/µm) @$V_d$ = 0.1 V | Enhancement (%) | $I_D$(µA/µm)@ $V_g$ - $V_{th}$ = 0.5 V, $V_d$ = 0.1 V | Enhancement (%) | $I_D$(µA/µm)@ $V_g$ - $V_{th}$ = 0.5 V, $V_d$ = 1 V | Enhancement (%) |
|---|---|---|---|---|---|---|
| Si MOSFET | 436 | — | 173 | — | 362 | — |
| GaAs MOSFET | 895 | 105 | 334 | 93 | 459 | 27 |
| GaAs MOSFET with Ge source-drain | 1004 | 130 | 409 | 136 | 544 | 50 |

It can be seen from Table 2 that, for the conductance $G_M$ characteristic, as compared with the Si MOSFET, the enhancement of the GaAs MOSFET with Ge source-drain according to the present invention reaches 130%, and as compared with the GaAs MOSFET, 12% enhanced. For the driving current $I_D$ characteristic, as compared with the GaAs MOSFET, the enhancement of the GaAs MOSFET with Ge source-drain according to the present invention in linear zone and saturation zone reach 22% and 18%, respectively.

According to the simulation results of the above field effect transistors, the hetero field-effect element with group III-V channel and group IV source-drain according to the present invention significantly improves the electrical properties. In addition, the epitaxy technique proposed by the present invention can be applied to other types of field effect elements, such as high-electron-mobility transistors.

Industrial Utility

The semiconductor device manufactured according to the present invention can be applied to logic element products, for example, metal-oxide semiconductor transistors, high-electron-mobility transistors (HEMT), or quantum well transistors formed on a $Si_xGe_{1-x}$ (x=0~1) top layer or Si(Ge) substrate.

Although the invention has been described with reference to the preferred embodiments, various modification and substitutions can be easily made without departure from the spirit and scope of the present invention which is defined by claims below.

A List of Reference Numerals

| | |
|---|---|
| 1 | metal-oxide semiconductor field effect transistor |
| 2 | quantum well field effect transistor |
| 3 | high-electron-mobility transistor |
| 4 | metal-oxide semiconductor high-electron-mobility transistor |
| 5 | quantum well field effect transistor |
| 10 | silicon substrate |
| 12 | deep source-drain region |
| 14 | shallow source-drain region |
| 16 | sidewall spacer |
| 17 | sidewall spacer |
| 20 | dielectric layer |
| 24 | sidewall spacer |
| 26 | trench |
| 28 | epitaxial material |
| 30 | N-type metal layer |
| 32 | dielectric layer |
| 100 | $Si_xGe_{1-x}$ substrate |
| 102 | P-type silicon substrate |
| 104 | P-type $Si_xGe_{1-x}$ layer |
| 106 | first silicon dioxide layer |
| 106a | dummy gate |
| 106b | residual first silicon dioxide layer |
| 108 | $n^+$ source-drain |
| 110 | second silicon dioxide layer |
| 112 | high-electron-mobility group III-V channel layer |
| 114 | high-dielectric-constant gate dielectric layer |
| 116 | contact holes |
| 118 | source-drain plug contacts |
| 120 | metal gate |
| 122 | backside contact |
| 124 | recess |
| 200 | $Si_xGe_{1-x}$ substrate |
| 202 | P-type silicon substrate |
| 204 | P-type $Si_xGe_{1-x}$ layer |
| 206 | first silicon dioxide layer |
| 206a | dummy gate |
| 206b | residual first silicon dioxide layer |
| 208 | $n^+$ source-drain |
| 210 | second silicon dioxide layer |
| 212 | group III-V first large-energy-gap confinement layer |
| 214 | group III-V small-energy-gap channel layer |
| 216 | group III-V second large-energy-gap confinement layer |
| 218 | stacked element having a group III-V quantum well structure |
| 220 | contact hole |
| 222 | source-drain plug contact |
| 224 | metal gate |
| 226 | backside contact |
| 228 | recess |
| 300 | $Si_xGe_{1-x}$ substrate |
| 302 | P-type silicon substrate |
| 304 | P-type $Si_xGe_{1-x}$ layer |
| 306 | first silicon dioxide layer |
| 306a | dummy gate |
| 306b | residual first silicon dioxide layer |
| 308 | $n^+$ source-drain |
| 310 | second silicon dioxide layer |
| 312 | group III-V undoped moderate-energy-gap confinement layer |
| 314 | group III-V undoped small-energy-gap channel layer |
| 316 | group III-V undoped large-energy-gap spacer layer |
| 318 | group III-V $n^+$-doped large-energy-gap confinement layer |
| 320 | stacked element having a group III-V two-dimension electron gas structure |
| 322 | contact hole |
| 324 | source-drain plug contact |
| 326 | metal gate |
| 328 | backside contact |
| 330 | recess |
| 400 | $Si_xGe_{1-x}$ substrate |
| 402 | P-type silicon substrate |
| 404 | P-type $Si_xGe_{1-x}$ layer |
| 406 | first silicon dioxide layer |
| 406a | dummy gate |
| 406b | residual first silicon dioxide layer |
| 408 | $n^+$ source-drain |
| 410 | second silicon dioxide layer |
| 412 | group III-V undoped moderate-energy-gap confinement layer |
| 414 | group III-V undoped small-energy-gap channel layer |
| 416 | group III-V undoped large-energy-gap spacer layer |
| 418 | group III-V $n^+$-doped large-energy-gap confinement layer |
| 420 | stacked element having a group III-V two-dimension electron gas structure |
| 422 | high-dielectric-constant gate dielectric layer |
| 424 | contact hole |
| 426 | source-drain plug contact |
| 428 | metal gate |
| 430 | backside contact |
| 432 | recess |
| 502 | group III-V substrate |
| 504 | group III-V first large-energy-gap confinement layer |
| 506 | group III-V small-energy-gap channel layer |
| 508 | group III-V second large-energy-gap confinement layer |
| 510 | stacked element having a group III-V quantum well structure |
| 512 | silicon dioxide layer |
| 512a | dummy gate |
| 512b | residual silicon dioxide layer |
| 514 | source-drain recess |
| 516 | group IV SiGe material |
| 518 | source-drain |
| 520 | metal gate |
| 522 | source-drain contact |
| 524 | recess |
| PR | resist |

What is claimed is:

1. A method for manufacturing a semiconductor device with group III-V channel and group IV source-drain, comprising:

preparing a substrate, the substrate selected from one of the group consisting of a Si substrate, a Ge substrate, a Si substrate with $Si_xGe_{1-x}$ (x=0~1) or GaN or silicon germanium carbide grown thereon, a Ge substrate with $Si_xGe_{1-x}$ (x=0~1) or GaN or silicon germanium carbide grown thereon, and a diamond substrate with $Si_xGe_{1-x}$ (x=0~1) or GaN or silicon germanium carbide grown thereon;

depositing a dummy gate material layer on the substrate and defining a dummy gate from the dummy gate material layer by photolithography;

doping the exposed region of the substrate by self-aligned ion implantation using the dummy gate as a mask and activating the exposed region at high temperature, so as to form source-drain;

removing the dummy gate;
forming a recess in the substrate between the source-drain pair by etching, the recess having a depth required for forming a channel-containing stacked element by subsequent epitaxy;
forming the channel-containing stacked element in the recess by epitaxy; and
forming a gate on the channel-containing stacked element.

2. A method of claim 1, wherein the crystal plane of the substrate is (100), (110), or (111), and its off-cut angle is 2, 4, or 6 degrees.

3. A method of claim 1, wherein the dummy gate material layer is a single layer made of insulating material or a stacked layer made of a plurality of insulating materials.

4. A method of claim 3, wherein the material of the dummy gate material layer is silicon oxide, silicon oxynitride, aluminum oxynitride, or hafnium oxynitride.

5. A method of claim 1, wherein the source-drain are made of doped $Si_xGe_{1-x}$ (x=0~1) or silicon germanium carbide.

6. A method of claim 1, wherein the channel-containing stacked element has a metal-oxide semiconductor structure, a quantum well structure, or a two-dimension electron gas structure, wherein the metal-oxide semiconductor structure consists of a metal layer, a high-dielectric-constant dielectric layer, and a group III-V channel layer; the quantum well structure consists of a large-energy-gap material layer, a small-energy-gap material layer functioning as a channel, and a large-energy-gap material layer; the two-dimension electron gas structure consists of a large-energy-gap heavily doped material layer, a large-energy-gap undoped material layer, a small-energy-gap undoped material layer functioning as a channel, and a moderate-energy-gap undoped material layer.

7. A method of claim 6, wherein the metal-oxide semiconductor structure consists of a TaN layer, an $HfO_2$ layer, and an InGaAs layer.

8. A method of claim 6, wherein the metal-oxide semiconductor structure consists of a TiN layer, an $Al_2O_3$ layer, and an InSb layer.

9. A method of claim 6, wherein the quantum well structure consists of a GaAs layer, a Ge layer, and a GaAs layer.

10. A method of claim 6, wherein the quantum well structure consists of a GaAs layer, an InGaAs layer, and a GaAs layer.

11. A method of claim 6, wherein the two-dimension electron gas structure consists of an N type AlGaAs layer, an AlGaAs layer, an InGaAs layer, and a GaAs layer.

12. A method of claim 6, wherein the two-dimension electron gas structure consists of an N type AlInAs layer, an AlInAs layer, an InGaAs layer, and an AlInAs layer.

13. A method of claim 1, wherein the material of the channel is InN, GaN, AlN, InP, InAs, InSb, GaAs, GaSb, or a compound consisting of them with different proportions.

14. A method of claim 1, wherein the epitaxy is performed by using a film formation system selected from the group consisting of a metal organic chemical vapor deposition (MOCVD) system, a molecular beam epitaxy (MBE) system, an ultra-high vacuum chemical vapor deposition (UHVCVD) system and an atomic layer deposition (ALD) system.

* * * * *